(12) United States Patent
Ozawa et al.

(10) Patent No.: US 11,485,801 B2
(45) Date of Patent: Nov. 1, 2022

(54) CRYSTALLINE RADICAL POLYMERIZABLE COMPOSITION FOR ELECTRICAL AND ELECTRONIC COMPONENT, MOLDED ARTICLE OF ELECTRICAL AND ELECTRONIC COMPONENT USING THE COMPOSITION, AND METHOD OF THE MOLDED ARTICLE OF ELECTRICAL AND ELECTRONIC COMPONENT

(71) Applicant: Japan U-Pica Company, Ltd., Tokyo (JP)

(72) Inventors: Yuichi Ozawa, Hiratsuka (JP); Tomohito Oyama, Tokyo (JP)

(73) Assignee: Japan U-Pica Company, Ltd., Tokyo (JP)

( * ) Notice: Subject to any disclaimer, the term of this patent is extended or adjusted under 35 U.S.C. 154(b) by 260 days.

(21) Appl. No.: 16/488,558

(22) PCT Filed: Feb. 20, 2018

(86) PCT No.: PCT/JP2018/006007
§ 371 (c)(1),
(2) Date: Aug. 23, 2019

(87) PCT Pub. No.: WO2018/159387
PCT Pub. Date: Sep. 7, 2018

(65) Prior Publication Data
US 2020/0231714 A1    Jul. 23, 2020

(30) Foreign Application Priority Data
Mar. 3, 2017 (JP) .............. JP2017-040824
Nov. 10, 2017 (JP) .............. JP2017-217528

(51) Int. Cl.
| | | |
|---|---|---|
| *C08F 2/44* | (2006.01) | |
| *C08F 220/32* | (2006.01) | |
| *C08F 220/34* | (2006.01) | |
| *C08F 220/18* | (2006.01) | |
| *C08F 220/28* | (2006.01) | |
| *B29C 45/00* | (2006.01) | |
| *B29C 43/00* | (2006.01) | |
| *C08L 33/08* | (2006.01) | |
| *C08K 3/013* | (2018.01) | |
| *B29K 33/00* | (2006.01) | |

(52) U.S. Cl.
CPC .............. *C08F 2/44* (2013.01); *B29C 43/003* (2013.01); *B29C 43/006* (2013.01); *B29C 45/0013* (2013.01); *C08F 220/18* (2013.01); *C08F 220/285* (2020.02); *C08F 220/32* (2013.01); *C08F 220/343* (2020.02); *C08L 33/08* (2013.01); *B29C 2045/0091* (2013.01); *B29K 2033/08* (2013.01); *B29K 2995/0041* (2013.01); *C08K 3/013* (2018.01); *C08L 2203/206* (2013.01)

(58) Field of Classification Search
CPC ...... C08F 2/44; C08F 220/32; C08F 220/343; C08F 220/18; C08F 220/285; B29C 45/0013; B29C 43/003; B29C 43/006; C08L 33/08; C08K 3/013
See application file for complete search history.

(56) References Cited

U.S. PATENT DOCUMENTS

| | | | |
|---|---|---|---|
| 4,290,938 | A | 9/1981 | Miyake et al. |
| 6,482,881 | B1 | 11/2002 | Shibata et al. |
| 2006/0135705 | A1 | 6/2006 | Vallance et al. |
| 2007/0023165 | A1 | 2/2007 | Lakes et al. |
| 2011/0159713 | A1* | 6/2011 | Sato .............. C08F 222/102 439/78 |
| 2015/0138778 | A1* | 5/2015 | Oyama ............ C08K 3/30 362/296.02 |

FOREIGN PATENT DOCUMENTS

| | | |
|---|---|---|
| CN | 104471732 A | 3/2015 |
| EP | 2629342 A1 | 8/2013 |
| EP | 2858133 A1 | 4/2015 |

(Continued)

OTHER PUBLICATIONS

Extended European Search Report for European Application No. 18760549.8, dated Sep. 15, 2020.

(Continued)

*Primary Examiner* — Robert D Harlan
(74) *Attorney, Agent, or Firm* — Birch, Stewart, Kolasch & Birch, LLP

(57) ABSTRACT

[Problems]
An object of the present invention is to provide a crystalline radical polymerizable composition which is excellent in flowability and is easy to handle.

[Solution Means]
The crystalline radical polymerizable composition for sealing electrical and electronic component according to the present invention is characterized by comprising at least a crystalline radical polymerizable compound, an inorganic filler, a silane coupling agent, and a radical polymerization initiator. In addition, in a preferred embodiment of the crystalline radical polymerizable composition for sealing electrical and electronic component according to the present invention, the crystalline radical polymerizable compound is characterized by comprising one or more selected from unsaturated polyester, epoxy (meth) acrylate, urethane (meth) acrylate, polyester (meth) acrylate, -polyether (meth) acrylate, radical polymerizable monomer and radical polymerizable polymer.

21 Claims, No Drawings

(56) References Cited

FOREIGN PATENT DOCUMENTS

| | | | |
|---|---|---|---|
| EP | 3306359 | A1 | 4/2018 |
| JP | 55-92719 | A | 7/1980 |
| JP | 2-97512 | A | 4/1990 |
| JP | 3-103413 | A | 4/1991 |
| JP | 7-331048 | A | 12/1995 |
| JP | 11-268905 | A | 10/1999 |
| JP | 2007-277309 | A | 10/2007 |
| JP | 2007-528437 | A | 10/2007 |
| JP | 2008-524867 | A | 7/2008 |
| JP | 2009-96839 | A | 5/2009 |
| JP | 2014-77071 | A | 5/2014 |
| JP | 2014-148586 | A | 8/2014 |
| JP | 2015-2204 | A | 1/2015 |
| JP | 5727628 | B2 | 6/2015 |
| JP | 2016-92112 | A | 5/2016 |
| JP | 6041157 | B2 | 12/2016 |
| JP | 2018-145280 | A | 9/2018 |
| WO | WO 2016/189726 | A1 | 12/2016 |
| WO | WO 2017/119406 | A1 | 7/2017 |

OTHER PUBLICATIONS

Japanese Office Action for Japanese Application No. 2017-217528, dated Nov. 19, 2019.
Japanese Office Action for Japanese Application No. 2019-220028, dated Jan. 12, 2021.
Chinese Office Action and Search Report, dated May 25, 2021, for Chinese Application No. 201880015561.5.
International Search Report for PCT/JP2018/006007 (PCT/ISA/210) dated May 15, 2018.

\* cited by examiner

CRYSTALLINE RADICAL POLYMERIZABLE COMPOSITION FOR ELECTRICAL AND ELECTRONIC COMPONENT, MOLDED ARTICLE OF ELECTRICAL AND ELECTRONIC COMPONENT USING THE COMPOSITION, AND METHOD OF THE MOLDED ARTICLE OF ELECTRICAL AND ELECTRONIC COMPONENT

TECHNICAL FIELD

The present invention relates to a crystalline radical polymerizable composition for sealing an electrical and electronic component, a sealed body of the electrical and electronic component sealed by the composition, a granular material comprising a crystalline radical polymerizable composition for sealing an electrical and electronic component, and a method of the sealed body of the electrical and electronic component.

Further, the present invention relates to a crystalline radical polymerizable composition for an electrical and electronic component, a molded body of the electrical and electronic component molded by the composition, a granular material comprising a crystalline radical polymerizable composition for an electrical and electronic component, and a method of the molded body of the electrical and electronic component.

BACKGROUND ART

An electrical and electronic component used for automobile, electric appliance is protected by a metal, a resin material in order to preserve from external factors such as dust, moisture and impact. Although a sealing of the electrical and electronic component by using metal has high reliability, since it is expensive, it has been replaced with a sealant by using a resin material which is low in price and has superior productivity. Further, the use of a sealant of the electrical and electronic component by using a resin material instead of metal makes it possible to reduce a size of the sealed electrical and electronic component because the resin material has electrical insulation, and to improve the degree of freedom in designing of an automobile or an electric appliance equipped with the electrical and electronic component. Further, since there are some possibilities that the electrical and electronic component can be used under severe conditions such as high temperature or high-humidity environment, in the case that the resin material is used, a thermosetting resin with excellent heat resistance has been widely used as the resin material.

In recent years, a liquid epoxy resin having good adhesion to a resin substrate or metal and excellent in mechanical strength and flowability has been used.

The amount of semiconductors used has significantly increased due to the spread of electronic control of automobiles and the spread of mobile devices and information appliances, and the importance of semiconductor sealing, which is one of electric and electronic component sealing, is also increasing. Sealing materials of semiconductor used for sealing semiconductor are mostly tablet-like epoxy molding compounds (EMC). Although an EMC is used in transfer molding methods that have high productivity, and has established high reliability because it is excellent in physical properties such as adhesion and linear expansion coefficient, since the frozen storage and post-curing steps are required, simplification of the method of use has been required.

From such a thing, the epoxy resin composition for sealing, an electronic device, a motor vehicle, and the method of manufacturing an electronic device, are known conventionally (for example, patent literature 1). Further, a method of manufacturing a semiconductor device and an acrylic resin composition for sealing semiconductor used therefor are known (for example, Patent literature 2).

In addition, in the electrical and electronic component used in automobiles and electric appliances, the heat generated from the electrical and electronic component causes deterioration of the electric and electronic equipment. Therefore, the heat is effectively dispersed by the metal wiring and the metal case such as aluminum. Since there is a possibility that the metal case may be over specification and there are also requirements for productivity, shape freedom and insulation, the substitution to a resin material advances. In addition, in the case of the use of a resin material, it is necessary to add a large amount of inorganic filler in order to impart thermal conductivity, so a thermosetting resin having low resin viscosity and excellent heat resistance is used.

From such a thing, the thermally conductive resin composition is known conventionally (for example, Patent literature 3). Further, unsaturated polyester resin compositions and sealed motors are known (for example, Patent literature 4).

PRIOR ART LITERATURE

Patent Literature

Patent literature 1 JP-A1-2014-148586
Patent literature 2 JP-A1-2015-2204
Patent literature 3 JP-A2-6041157
Patent literature 4 JP-A2-5727628

DISCLOSURE OF THE INVENTION

Problems to be Resolved by the Invention

An seal molding using a liquid epoxy resin is manufactured by a method with relatively low productivity, such as compression molding and casting. Therefore, a highly productive manufacturing method has been expected.

In the above described patent literature 1, the epoxy resin composition for sealing is molded by the transfer molding method. The epoxy resin composition used for transfer molding needs to bring back the resin composition stored frozen to room temperature. When the epoxy resin composition is stored at room temperature, the flowability is greatly reduced, and since complete curing does not occur during molding time, there are problems such as post-curing for several hours in order to obtain necessary molded article characteristics.

Further, although Patent literature 1 discloses (meth)acrylate resin, unsaturated polyester resin, diallyl phthalate resin which is a radical polymerizable compound as a thermosetting resin, there are no detailed descriptions of a specific method of using these radical polymerizable compounds, the examples etc. Furthermore, since there are no descriptions of a radical polymerization initiator as a curing agent, three-dimensional crosslinking of a radical polymerizable compound can not be achieved even if a (meth)acrylate resin, an unsaturated polyester resin or a diallyl phthalate resin is used. Therefore, the curing agent disclosed in Patent literature 1 is limited to one that can achieve a three-dimensionally crosslink with the epoxy resin. Thus, in fact, Patent literature 1 is for the content of an epoxy resin composition.

In the above described patent literature 2, the acrylic resin composition for semiconductor sealing is liquid at normal temperature. Although the fluidity is very good because it is liquid at normal temperature, since the acrylic resin composition is liquid at normal temperature, it is sticky, it has poor workability and handling performance, and it is impossible to deal with the acrylic resin composition in conventional molding machines wherein the acrylic resin composition is used in the solid form of pellets or tablets at normal temperature. In addition, since bubbles tend to remain in the resin composition during molding by casting, it is difficult to control the bubbles. Further, the liquid resin composition has a problem that in a liquid resin composition, it is difficult to obtain a uniform molded product because the filler tends to settle down below when using an inorganic filler, as compared with a solid resin composition.

Therefore, it is an object of the present invention to provide a crystalline radical polymerizable composition having an excellent flowability and a good handleability.

Moreover, in the above described patent literature 3, since the thermally conductive filler with a projection/recess structure on its surface is used, it is a resin composition with high thermal conductivity. In general, a molding material having a high thermal conductivity coefficient contains a large amount of a thermally conductive filler, so that the flowability is lowered, so the moldability is inferior and the application is limited. In addition, since materials having insulating properties and high thermal conductivity are expensive, their applications are limited due to their poor versatility.

In Patent Literature 4 described above, BMC (bulk molding compound) requires a dedicated injection molding machine, so it is necessary to prepare a dedicated molding machine. In addition, BMC has poor storage stability, so there is a problem that, for example, BMC causes gelation in summer.

Therefore, it is an object of the present invention to provide a crystalline radical polymerizable composition which is excellent in thermal conductivity and good in handleability.

Means of Solving the Problems

The present inventors made strenuous studies on composition including at least one of a crystalline radical polymerizable compound from a viewpoint of various perspectives. As a result, the inventors discovered a crystalline radical polymerizable composition for sealing an electrical and electronic component according to the present invention.

That is, a crystalline radical polymerizable composition for sealing an electrical and electronic component is characterized by comprising at least a crystalline radical polymerizable compound, an inorganic filler, a silane coupling agent, and a radical polymerization initiator.

Further, in a preferred embodiment of the above mentioned crystalline radical polymerizable composition for sealing an electrical and electronic component according to the present invention, it is characterized in that the crystalline radical polymerizable compound comprises one or more selected from unsaturated polyester, epoxy (meth) acrylate, urethane (meth) acrylate, polyester (meth) acrylate, polyether (meth) acrylate, radical polymerizable monomer, and radical polymerizable polymer.

Further, in a preferred embodiment of the above mentioned crystalline radical polymerizable composition for sealing an electrical and electronic component according to the present invention, it is characterized in that the crystalline radical polymerizable compound exhibits a melting point in the range of 30 to 150° C.

Further, in a preferred embodiment of the above mentioned crystalline radical polymerizable composition for sealing an electrical and electronic component according to the present invention, it is characterized in that the crystalline radical polymerizable composition is solid at 23° C.

Further, in a preferred embodiment of the above mentioned crystalline radical polymerizable composition for sealing an electrical and electronic component according to the present invention, it is characterized in that the melt viscosity of the crystalline radical polymerizable composition according to a Koka-type flow tester is 7 to 1000 Pa·s under the condition of a measured temperature of 90° C., a die diameter of 0.5 mm, a length of 1.0 mm and a pressure of 30 kgf/cm$^2$, or 1 to 7 Pa·s at a pressure of 1 kgf/cm$^2$.

Further, in a preferred embodiment of the above mentioned crystalline radical polymerizable composition for sealing an electrical and electronic component according to the present invention, it is characterized in that an amount of an inorganic filler is 50 to 95 percent by weight for total amount of the crystalline radical polymerizable composition.

Further, in a preferred embodiment of the above mentioned crystalline radical polymerizable composition for sealing an electrical and electronic component according to the present invention, it is characterized in that the ratio of the crystalline radical polymerizable compound to a total amount of radical polymerizable compound is 30 parts by weight or more.

Further, in a preferred embodiment of the above mentioned crystalline radical polymerizable composition for sealing an electrical and electronic component according to the present invention, it is characterized in that the weight average molecular weight of the crystalline radical polymerizable compound is 100 to 100,000.

Further, a sealed body of an electrical and electronic component according to the present invention is characterized by sealing by the crystalline radical polymerizable composition for sealing an electrical and electronic component according to the present invention.

Further, a granular material according to the present invention is characterized by comprising the crystalline radical polymerizable composition for sealing an electrical and electronic component according to the present invention.

Further, a method of producing a sealed body of an electrical and electronic component is characterized by comprising a step of molding the granular material comprising the crystalline radical polymerizable composition for sealing an electrical and electronic component according to the present invention by means of an insert molding method by an injection molding method or a transfer molding method to seal an electrical and electronic component.

Further, the present inventors made strenuous studies on composition including at least one of a crystalline radical polymerizable compound from a viewpoint of various perspectives. As a result, the inventors discovered a crystalline radical polymerizable composition for an electrical and electronic component according to the present invention.

That is, a crystalline radical polymerizable composition for an electrical and electronic component is characterized by comprising at least a crystalline radical polymerizable compound, an inorganic filler, a silane coupling agent, and a radical polymerization initiator.

Further, in a preferred embodiment of the above mentioned crystalline radical polymerizable composition for an electrical and electronic component according to the present invention, it is characterized in that a coefficient of thermal conductivity of the molded body obtained by molding the crystalline radical polymerizable composition for electric and electronic component is 1.0 W/m·K or more.

Further, in a preferred embodiment of the above mentioned crystalline radical polymerizable composition for an electrical and electronic component according to the present invention, it is characterized in that the crystalline radical polymerizable compound comprises one or more selected from unsaturated polyester, epoxy (meth) acrylate, urethane (meth) acrylate, polyester (meth) acrylate, polyether (meth) acrylate, radical polymerizable monomer, and radical polymerizable polymer.

Further, in a preferred embodiment of the above mentioned crystalline radical polymerizable composition for an electrical and electronic component according to the present invention, it is characterized in that the crystalline radical polymerizable compound exhibits a melting point in the range of 30 to 150° C.

Further, in a preferred embodiment of the above mentioned crystalline radical polymerizable composition for an electrical and electronic component according to the present invention, it is characterized in that the crystalline radical polymerizable composition is solid at 23° C.

Further, in a preferred embodiment of the above mentioned crystalline radical polymerizable composition for an electrical and electronic component according to the present invention, it is characterized in that an amount of an inorganic filler is 40 to 95 percent by weight for total amount of the crystalline radical polymerizable composition.

Further, in a preferred embodiment of the above mentioned crystalline radical polymerizable composition for an electrical and electronic component according to the present invention, it is characterized in that the ratio of the crystalline radically polymerizable compound to a total amount of radically polymerizable compound is 25 parts by weight or more.

Further, in a preferred embodiment of the above mentioned crystalline radical polymerizable composition for an electrical and electronic component according to the present invention, it is characterized in that the weight average molecular weight of the crystalline radical polymerizable compound is 70 to 100,000.

Further, a molded body of an electrical and electronic component according to the present invention is characterized by being molded by the crystalline radical polymerizable composition for an electrical and electronic component.

Further, in a preferred embodiment of the above mentioned molded body of an electrical and electronic component according to the present invention, it is characterized in that a coefficient of thermal conductivity of the molded body obtained by molding the crystalline radical polymerizable composition for the electric and electronic component is 1.0 W/m·K or more.

Further, a granular material according to the present invention is characterized by comprising the crystalline radical polymerizable composition for an electrical and electronic component according to the present invention.

Further, a method of producing a molded body of an electrical and electronic component according to the present invention is characterized by comprising a step of molding the granular material comprising the crystalline radical polymerizable composition for an electrical and electronic component according to the present invention by means of any one of an injection molding method, a transfer molding method, a compression molding method or a hot melt molding method to obtain the molded body of the electrical and electronic component.

Effect of Invention

A crystalline radical polymerizable composition for sealing an electrical and electronic component according to the present invention has an advantage effect that it has an excellent handleability. Further, a method of producing a sealed body of an electrical and electronic component according to the present invention has an advantage effect that because the crystalline radical polymerizable composition having an extremely low degree of viscosity can be obtained when the composition is heated and melted during an injection molding, or a transfer molding, a flowability necessary for sealing a sealed body of an electrical and electronic component can be obtained.

Further, the present invention can provide a sealed body of an electrical and electronic component sealed by a crystalline radical polymerizable composition for sealing an electrical and electronic component.

Further, the present invention can provide a method of producing a sealed body of an electrical and electronic component having a step of molding granular material, powder or tablet comprising the crystalline radical polymerizable composition for sealing an electrical and electronic component according to the present invention by means of an insert molding method to seal the electrical and electronic component.

Further, a crystalline radical polymerizable composition for an electrical and electronic component according to the present invention has an advantage effect that it has an excellent thermal conductivity and an excellent handleability. Further, a method of producing a molded body of an electrical and electronic component according to the present invention has an advantage effect that because the crystalline radical polymerizable composition having a low degree of viscosity can be obtained when the composition is heated and melted during an injection molding, or a transfer molding, a flowability necessary for molding a molded body of an electrical and electronic component can be obtained. Further, the present invention can provide a molded body of an electrical and electronic component molded by a crystalline radical polymerizable composition for an electrical and electronic component according to the present invention.

Furthermore, a method of producing a molded body of an electrical and electronic component according to the present invention can be produced by using granular material, powder or tablet comprising the crystalline radical polymerizable composition for an electrical and electronic component according to the present invention.

MODE FOR CARRYING OUT THE INVENTION

At first, an example embodiment of the crystalline radical polymerizable composition for sealing an electrical and electronic component according to the present invention will be described as follows.

A crystalline radical polymerizable composition for sealing an electrical and electronic component according to the present invention is characterized by comprising at least a crystalline radical polymerizable compound, an inorganic filler, a silane coupling agent, and a radical polymerization initiator. This is because the use of the crystalline radical polymerizable composition can realize a polymerizable composition having an excellent in fluidity and an excellent in handling as shown in Examples described later. Moreover, in the specification, the crystalline radical polymerizable composition for sealing an electrical and electronic component may be called a crystalline radical polymerizable composition.

Further, in a preferred embodiment of the above mentioned crystalline radical polymerizable composition for sealing an electrical and electronic component according to the present invention, it is characterized in that the crystalline radical polymerizable compound comprises one or more selected from unsaturated polyester, epoxy (meth) acrylate, urethane (meth) acrylate, polyester (meth) acrylate, polyether (meth) acrylate, radical polymerizable monomer, and radical polymerizable polymer.

Although the word "crystalline" may be omitted in this paragraph, specifically, the crystalline radical polymerizable compound can comprise at least one selected from a crystalline unsaturated polyester, a crystalline epoxy (meth) acrylate, a crystalline urethane (meth) acrylate, a crystalline polyester (meth) acrylate, a crystalline radically polymerizable monomer, and a crystalline radically polymerizable polymer. When these polymerizable compounds are used, mechanical properties and handleability become good (also in the following, the word "crystalline" may be omitted similarly).

Moreover, in the present specification, a crystalline compound can be a compound having a glass transition point and a melting point. These temperatures can be confirmed by a thermal analyzer such as DSC (a differential scanning calorimeter), TGDTA (a thermal gravimetric-differential thermal analyzer) or the like. The crystalline compound in the present invention can be a compound whose melting point can be confirmed by a thermal analyzer.

Further, in a preferred embodiment of the above mentioned crystalline radical polymerizable composition for sealing an electrical and electronic component according to the present invention, it is characterized in that from a viewpoint of workability and moldability, a melting point of the crystalline radical polymerizable compound is in the range of 30 to 150° C., more preferably in the range of 30 to 120° C., and still more preferably in that range of 30 to 100° C. This is because that the use of the crystalline radically polymerizable compound having a melting point in the range of 30 to 150° C. makes it possible to realize better handleability as compared with the case where a crystalline radical polymerizable compound having a melting point of less than 30° C., or a crystalline radical polymerizable compound having a melting point of more than 150° C. When the melting point of the crystalline radical polymerizable compound is lower than the above range, the crystalline radical polymerizable composition is likely to be in a liquid state at normal temperature, which may make it difficult for the crystalline radical polymerizable composition to maintain a solid state. If the melting point of the crystalline radical polymerizable compound is higher than the above range, since it will be close to the molding temperature of the mold, the time from the start of flow to curing will become short, and there is possibility that molding defects may occur.

Moreover, when only the crystalline radical polymerizable compound whose melting point is less than 30° C. is used, there is a tendency that it is difficult to become a crystalline radical polymerizable composition in a solid state at 23° C. On the other hand, when only the crystalline radical polymerizable compound having a melting point higher than 150° C. is used, since the cylinder temperature and the temperature of the mold are close, during plasticizing the crystalline radical polymerizable composition in the cylinder in the case of injection molding, there is a tendency that its stability in the cylinder becomes poor.

Further, in a preferred embodiment of the crystalline radical polymerizable composition for sealing electrical and electronic component according to the present invention, from the viewpoint of the handleability of the crystalline radical polymerizable compound, the crystalline radical polymerizable composition is characterized by being a solid state at 23° C. The above range is set because the shape of the composition does not change in the production, molding, and transportation environment of the crystalline radical polymerizable composition, and continuous production can be performed under general-purpose production equipment and conditions. In addition, a solid state may means that a shape and a volume can not be easily changed by external force.

Further, in a preferred embodiment of the crystalline radical polymerizable composition for sealing the electrical and electronic component of the present invention, from the viewpoint of flowability, the melt viscosity of the crystalline radical polymerizable composition measured by a a Koka-type flow tester can be in the range of 7 to 1000 Pa·s with a pressure of 30 kgf/cm$^2$ at a measurement temperature of 90° C., a die diameter of 0.5 mm, a die length of 1.0 mm, or in the range of 1 to 7 Pa·s with a pressure of 1 kgf/cm$^2$, more preferably in the range of 1 to 100 Pa·s. If the melt viscosity of the crystalline radical polymerizable composition is lower than the above range, a large amount of thin burrs will be generated to make it difficult for the burrs to come off from the mold, and furthermore, since the composition gets into the gaps of the mold, and thus continuous molding become difficult. If the melt viscosity is higher than the above range, there is a possibility that the fillability at the time of molding may be poor, and the product may not be obtained.

Further, in a preferred embodiment of the crystalline radical polymerizable composition for sealing the electrical and electronic component of the present invention, from the viewpoint of a product quality, the inorganic filler may be 50 to 95% by weight, more preferably 55 to 93% by weight, and still more preferably 60 to 90% by weight, for total amount of the crystalline radical polymerizable composition. The above range is set because there is a possibility that when the amount of the inorganic filler is less than the above range, the shrinkage ratio is large and the molded product is deformed, and when the amount of the inorganic filler is more than the above range, the melt viscosity at the time of molding is high and the load is applied to the inserted substance and the inserted substance may be damaged.

Further, in a preferred embodiment of the crystalline radical polymerizable composition for sealing the electrical and electronic component according to the present invention, the ratio of the crystalline radical polymerizable compound to the total amount of radical polymerizable compound is 30 parts by weight or more, more preferably 40 parts by weight or more, and still more preferably 50 parts by weight or more from the viewpoint of maintaining a solid state. The reason for the above range is that when the ratio of the crystalline radical polymerizable compound is smaller than the above range, there is a possibility that it may be difficult to become solid. Moreover, the radical polymerizable compound may include a crystalline radical polymerizable compound and an amorphous radical polymerizable compound, and here, an example of a preferred embodiment of the ratio of the crystalline radical polymerizable compound with respect to the total amount of these radical polymerizable compounds is prescribed.

Further, in a preferred embodiment of the above mentioned crystalline radical polymerizable composition for sealing an electrical and electronic component according to the present invention, from the viewpoint of quality control of the crystalline radical polymerizable composition, it is characterized in that the weight average molecular weight of the crystalline radical polymerizable compound may be 100 to 100,000, more preferably 100 to 50,000, and still more preferably 150 to 30,000. This is because that if the weight average molecular weight of the crystalline radical polymerizable compound is smaller than the above range, the crystalline radical polymerizable composition is unlikely to be solid, and if the weight average molecular weight of the crystalline radical polymerizable compound is larger than the above range, since the molecular weight of the crystalline radical polymerizable composition can not be controlled with high accuracy, there is a possibility that the compound characteristics and the composition characteristics may fluctuate.

Further, a sealed body of an electrical and electronic component according to the present invention is characterized by being sealed by the crystalline radical polymerizable composition for sealing an electrical and electronic component according to the present invention.

Further, a granular material according to the present invention is characterized by comprising the crystalline radical polymerizable composition for sealing an electrical and electronic component according to the present invention. Although the word "the granular material" is used, the present invention may be a powder or a tablet or the like other than the granular material. That is, in the case of those other than the granular material (the particulate matter or granular matter), the powder, the tablet and the like of the present invention can be composed of the crystalline radical polymerizable composition for sealing the electrical and electronic component of the present invention.

Further, a method of producing a sealed body of an electrical and electronic component is characterized by comprising a step of molding the granular material comprising the crystalline radical polymerizable composition for sealing an electrical and electronic component according to the present invention by means of an insert molding method by an injection molding method or a transfer molding method to seal the electrical and electronic component.

The sealed body of the electrical and electronic component is a sealed body including an inserted substance. The sealed body of the electric and electronic component is a molded body in which a capacitor, an integrated circuit or the like is joined to a substrate and integrally covers them. The electric and electronic components joined to the substrate may cause damage to the electric and electronic components (parts) due to flow pressure in injection molding or transfer molding using a high viscosity molding material. Moreover, in the present invention, the electric and electronic components can include semiconductors and the like in addition to so-called electric and electronic components or parts. Therefore, these sealed bodies of the electrical and electronic component can be used also for semiconductor sealing bodies. In short, the composition of the present invention can be widely applied to a sealed body that requires handling, flowability, and the like.

A composition having a low melt viscosity and good fluidity has a possibility of causing a problem in handleability because the composition is soft even at normal temperature. In addition, there is a possibility that the soft composition becomes a block, and in the injection molding method, the fusion of the composition occurs in the hopper, and in the transfer molding method, the tablet molded in advance is fused and further, the shape change occurs and a problem that the molded tablet does not enter into the insertion hole of the tablet in the transfer molding machine may occur. The present invention achieves excellent effects having high productivity by achieving both fluidity and handleability.

<A Method of Producing an Unsaturated Polybasic Acid>

An unsaturated polyester used for the present invention, as an example, can be obtained by reacting with an unsaturated polybasic acid, a saturated polybasic acid and glycols according to a known dehydration condensation reaction, and thereby having an acid value of 2 to 40 mg-KOH/g generally. It is possible to obtain an unsaturated polyester having a crystallinity by selecting an acid component or a combination of an unsaturated polybasic acid, a saturated polybasic acid, and selecting or a combination of glycols, and selecting a ratio of formulation thereof accordingly in a manufacture of an unsaturated polyester.

As an unsaturated polybasic acid, mention may be made of maleic acid, maleic anhydride, fumaric acid, citraconic acid, mesaconic acid, itaconic acid, tetrahydrophthalic acid, tetrahydrophthalic anhydride, methyltetrahydrophthalic anhydride, glutaconic acid etc.

As a saturated polybasic acid, mention may be made of phthalic acid, phthalic anhydride, isophthalic acid, terephthalic acid, succinic acid, adipic acid, sebacic acid, azelaic acid, tetrahydrophthalic anhydride, methyltetrahydrophthalic anhydride, endo methylene-tetra-hydro phthalic anhydride, HET acid, tetrabromophthalic anhydride etc.

As glycols, mention may be made of ethylene glycol, 1,3-propanediol, 1,4-butanediol, 1,5-pentanediol, 1,6-hexanediol, 1,8-octanediol, propylene glycol, diethylene glycol, triethylene glycol, dipropylene glycol, neopentyl glycol, 1,3-butanediol, hydrogenated bisphenol-A, bisphenol-A propylene oxide adduct compound, cyclohexanedimethanol, dibromo neopentyl glycol, etc.

In the present invention, among a crystalline unsaturated polyester, an unsaturated polyester is preferable wherein fumaric acid is used as an unsaturated polybasic acid, isophthalic acid or terephthalic acid is used as a saturated polybasic acid, ethylene glycol, 1,3-propanediol, 1,4-butanediol, 1,5-pentanediol, 1,6-hexanediol, 1,8-octanediol, cyclohexanedimethanol are used as a primary component of glycol.

<A Method of Producing an Epoxy (Meth) Acrylate>

The epoxy (meth) acrylates used in the present invention can be prepared in a manner known per se. The epoxy (meth) acrylates having crystallinity can be obtained by appropriately selecting an epoxy resin and an unsaturated basic acid in the presence or absence of a known inhibitor, a known esterification catalyst, under the conditions in an inert gas stream or in an air atmosphere. If necessary, other radical polymerizable monomers and organic solvents can be added and reacted for the purpose of lowering the melt viscosity of the reaction system.

An epoxy (meta) acrylate in the present invention, as an example, can be an epoxy (meta) acrylate having a double bond of an acrylate or a methacrylate at the end of molecule obtained by the addition reaction of acrylic acid or methacrylic acid to an epoxy resin having two or more of glycidyl ether groups in one molecule. An epoxy (meta) acrylate can be an epoxy (meta) acrylate resin wherein epoxy acrylate is melted to a radical polymerizable monomer and/or a radical polymerizable prepolymer. As the above epoxy resin having two or more of glycidyl ether group in one molecule, for example, mention may be made of epoxy resin such as a bisphenol type of epoxy resin derived from bisphenol A, bisphenol F, bisphenol S etc., or these derivative, a bixylenol type of epoxy resin derived from bixylenol or the derivative thereof, a biphenol type of epoxy resin derived from biphenol or the derivative thereof, or naphthalene type of epoxy resin derived from naphthalene or the derivative thereof, and further novolak type of epoxy resin. There can be used by itself or the combination of two or more. The epoxy equivalent which becomes a standard of the molecular weight of the epoxy resin is preferably 174 to 2000 eq/g.

<A Method of Producing a Urethane (Meta) Acrylate>

Moreover, urethane (meta) acrylate in the present invention, as an example, can be a urethane acrylate having a double bond of acrylate or methacrylate at the end of molecule obtained by reacting polyalcohol and/or polyester polyol and/or polyether polyol having two or more of hydroxyl groups in one molecule with diisocyanate to add isocyanate groups at the end of molecule and/or one or more of isocyanate groups in one molecule to react these isocyanate groups with a compound having an alcoholic hydroxyl group and one or more of acrylate groups or methacrylate groups, or by reacting a compound having an alcoholic hydroxyl group and one or more of acrylate groups or methacrylate groups with isocyanate firstly so as to maintain isocyanate group, and then by reacting a remaining isocyanate groups with polyalcohol and/or polyester polyol and/or polyether polyol having two or more of hydroxyl groups in one molecule. In the production of urethane (meth) acrylate, it is possible to obtain a urethane (meth) epoxy acrylate which has crystallinity, by appropriately selecting a combination of isocyanate, polyalcohol and/or polyester polyol and/or polyether polyol, and a compound having alcoholic hydroxyl group and one or more acrylate group or methacrylate group. It may be urethane (meth) acrylate resin obtained by dissolving urethane acrylate or urethane methacrylate to a radical polymerizable monomer and/or a radical polymerizable polymer such as styrene, diethylene glycol dimethacrylate. These may be used by itself or by the combination of two or more thereof.

As an example of the compound having the alcoholic hydroxyl group and one or more acrylate groups or methacrylate groups, hydroxyethyl (meth) acrylate, 2-hydroxypropyl (meth) acrylate, 2-hydroxybutyl (meth) acrylate, phenoxyhydroxypropyl (meth) acrylate, trimethylolpropane di(meth) acrylate, dipropylene glycol mono(meth) acrylate and the like can be used.

Also, as an example of the polyalcohol having two or more hydroxyl groups in one molecule, neopentyl glycol, ethylene glycol, 1,3-propanediol, 1,2-butanediol, 1,3-butanediol, 1,4-butanediol, 1,5-pentanediol, 1,6-hexanediol, 1,7-heptanediol, 1,8-octanediol, 1,9-nonanediol, 1,10-decanediol, propylene glycol, diethylene glycol, dipropylene glycol, trimethylene glycol, hydrogenated bisphenol A, bisphenol A ethylene oxide adduct, bisphenol A propylene oxide adduct and the like can be used by itself or by the combination of two or more thereof. Also, as an example of the polyester polyols having two or more hydroxyl groups in one molecule, saturated polyester polyol having a molecular weight of 1000 to 2000 obtained from the dehydration condensation reaction of a polyalcohol such as neopentyl glycol, ethylene glycol, propylene glycol, diethylene glycol, dipropylene glycol, trimethylene glycol, hydrogenated bisphenol A, bisphenol A ethylene oxide adduct, bisphenol A propylene oxide adduct with a polybasic acid such as adipic acid, (anhydride) phthalic acid, isophthalic acid, terephthalic acid and trimellitic acid can be used by itself or by the combination of two or more thereof. Also, as an example of the polyether polyol having two or more hydroxyl groups in one molecule, polyethylene glycol or polypropylene glycols having a molecular weight of 300 to 2000 obtained by ring-opening reaction of ethylene oxide or propylene oxide, or polycaprolactone etc., obtained by ring-opening reaction of caprolactone can be used by itself or by the combination of two or more thereof.

As an example of the isocyanate compound having two or more isocyanate groups in one molecule, an aromatic and/or an aliphatic isocyanate compound can be used. For example, mention may be made of tolylene diisocyanate, diphenylmethane diisocyanate, hydrogenated diphenylmethane diisocyanate, 1,6-hexamethylene diisocyanate, isophorone diisocyanate, xylylene diisocyanate, hydrogenated xylylene diisocyanate, trifunctional isocyanate in which bifunctional isocyanate compounds have trimer isocyanurate rings, and a commercially available isocyanate prepolymers modified with polyol etc. These can be used alone or in combination of two or more.

<A Method of Producing a Polyester (Meth) Acrylate>

Further, the polyester (meth) acrylate in the present invention, for example, can be polyester acrylate or a polyester methacrylate having double bonds of acrylate or methacrylate at the molecular terminal obtained by an esterification of polyester polyol with acrylic acid or methacrylic acid, or a reaction of acid-terminated polyester with acrylate or methacrylate having a glycidyl group. In the production of polyester (meth) acrylate, it is possible to obtain a polyester (meth) acrylate which has crystallinity, by appropriately selecting a combination of polyester polyol and acrylic acid or methacrylic acid, or a combination of acid-terminated polyester and acrylate or methacrylate having a glycidyl group. It may be polyester acrylate resin or polyester methacrylate resin obtained by dissolving polyester acrylate or polyester methacrylate to a radical polymerizable monomer and/or a radical polymerizable polymer such as styrene, diethylene glycol dimethacrylate etc. These may be used by itself or by the combination of two or more thereof.

<A Method of Producing a Polyether (Meth) Acrylate>

Further, the polyether (meth) acrylate in the present invention, for example, can be polyether acrylate or a polyether methacrylate having double bonds of acrylate or methacrylate at the molecular terminal obtained by an esterification of polyether polyol with acrylic acid or methacrylic acid, or a reaction of acid-terminated polyether with acrylate or methacrylate having a glycidyl group. In the production of polyether (meth) acrylate, it is possible to obtain a polyether (meth) acrylate which has crystallinity, by appropriately selecting a combination of polyether polyol and acrylic acid or methacrylic acid, or a combination of acid-terminated polyether and acrylate or methacrylate having a glycidyl group. It may be polyether acrylate resin or polyether methacrylate resin obtained by dissolving polyether acrylate or polyether methacrylate to a radical polymerizable monomer and/or a radical polymerizable polymer such as styrene, diethylene glycol dimethacrylate etc. These may be used by itself or by the combination of two or more thereof.

Further, in a preferred embodiment, the crystalline radical polymerizable monomer of the present invention which is solid state at 30 to 150° C. can include one or more selected from ethoxylated isocyanuric acid triacrylate (melting point: about 50° C.), polyethylene glycol di(meth) acrylate (melting point: 35 to 53° C.), methoxypolyethylene glycol (meth)

acrylate (melting point: 33 to 40° C.), behenyl acrylate (melting point: 46° C.), tetramethyl piperinidyl methacrylate (melting point: 56 to 60° C.), trimethallyl isocyanurate (melting point: 83 to 87° C.), diacetone acrylamide (melting point: about 56° C.), itaconic acid dimethyl ester (melting point: 36° C.), vinyl stearate (melting point: 36° C.), N-vinylcarbazole (melting point: 67° C.), N-methylol acrylamide (melting point: 71 to 75° C.), acrylamide (melting point: 84° C.), tolylene allyl carbamate (melting point: 85 to 110° C.), maleimide (melting point: 93° C.) and acenaphthylene (melting point: 95° C.). When these crystalline radical polymerizable compounds are used, the handleability can be improved.

As the radical polymerizable monomer in the present invention, a radical polymerizable monomer which is liquid state at normal temperature can be used as long as the object of the invention is not impaired. For example, mention may be made of styrene monomers having a vinyl group, vinyl aromatic compounds such as α-methylstyrene, vinyl toluene, α-chlorostyrene and the like; vinyl esters such as vinyl acetate, vinyl propionate, vinyl lactate, vinyl butyrate, veova monomer (manufactured by Shell Chemical Co., Ltd.), etc.; (meth) acrylic esters such as methyl acrylate, ethyl acrylate, n-butyl acrylate, methyl methacrylate, ethyl methacrylate, n-butyl methacrylate and the like.

Further, bifunctionals or more of the radical polymerizable monomers such as triallyl cyanurate, diethylene glycol dimethacrylate, diallyl tetrabromophthalate, phenoxyethyl acrylate, 2-hydroxyethyl acrylate, 1,6-hexanediol diacrylate, diallyl phthalate and triallyl isocyanurate having allyl group etc., can be used. These radical polymerizable monomers may be used by itself or in combination of two or more.

As the radical polymerizable polymer in the present invention, diallyl phthalate prepolymer, TAIC™ prepolymer, epoxy prepolymer, urethane prepolymer, acrylate prepolymer may be used. These radical polymerizable polymer may be used by itself or in combination of two or more.

In the crystalline radical polymerizable composition for sealing the electrical and electronic component of the present invention, an inorganic filler can be blended. As an example of the inorganic filler, mention may be made of calcium carbonate, magnesium carbonate, barium carbonate, calcium hydroxide, aluminum hydroxide, magnesium hydroxide, magnesium oxide, alumina, silica, zinc oxide, mica, aluminum nitride and boron nitride. Among them, silica is preferable from the viewpoint of flowability. These may be used by itself or in combination of two or more.

The inorganic filler wherein the average particle diameter of the inorganic filler is within a range of 100 µm or less, preferably within a range from 0.01 to 50 µm can be used. The use of the inorganic filler having the above range of the average particle diameter makes it possible to obtain the crystalline radical polymerizable composition for sealing the electrical and electronic component having a superior flowability for molding, a superior strength.

In the crystalline radical polymerizable composition for sealing the electrical and electronic component of the present invention, a various sort of additives in close contact with an inorganic filler, a reinforcing material, for example, a (meth) acrylate compound having a polar group and a coupling agent can be blended.

The (meth) acrylate compound having a polar group is not particularly limited, and examples thereof may include (meth) acrylate compounds in which a substituent group containing an atom other than carbon and hydrogen is ester-linked. As examples of the substituent group, mention may be made of a hydroxyl group and epoxy groups, glycidyl ether group, tetrahydrofurfuryl group, isocyanate group, carboxyl group, alkoxysilyl group, phosphoric acid ester group, lactone group, oxetane group, tetrahydropyranyl group, amino group and the like. The coupling agent is not particularly limited, and for example, a silane series coupling agent or a titanate series coupling agent can be used. As the silane series coupling agent, for example, an epoxysilane series, an aminosilane series, a cationic silane series, a vinylsilane series, an acrylsilane series, a mercaptosilane series, and a composite system of these can be used.

Among these, acrylic silane series coupling agents are preferable from the viewpoint of strength improvement. Besides, any additives can be used as long as the object of the present invention is not impaired.

In the crystalline radically polymerizable composition for sealing the electrical and electronic component of the present invention, as a radical polymerization initiator, a thermal decomposition type organic peroxide, a polymerization inhibitor which is generally used for an unsaturated polyester resin composition or a radical polymerizable composition, can be used.

As organic peroxides, mention may be made of t-butylperoxy-2-ethylhexyl monocarbonate, 1,1-di(t-hexylperoxy) cyclohexane, 1,1-di(t-butylperoxy)-3,3,5-trimethylcyclohexane, t-butylperoxy octoate, benzoyl peroxide, methyl ethyl ketone peroxide, acetylacetone peroxide, t-butylperoxybenzoate, dicumyl peroxide and the like. These may be used by itself or in combination of two or more.

Among them, from a viewpoint of molding conditions and stability of storage, the use of organic peroxide wherein the 10 hours half-life temperature is 100° C. or more, is preferable, and specifically dicumyl peroxide can be used preferably.

As a polymerization inhibitor, mention may be made of quinones such as hydroquinone, monomethyl ether hydroquinone, toluhydroquinone, di-t-4-methylphenol, monomethyl ether hydroquinone, phenothiazine, t-buthyl catechol, parabenzoquinone, pyrogallol etc., a phenolic series compound such as 2,6-di-t-butyl-cresol, 2,2-methylene-bis-(4-methyl-6-t-butyl phenol), 1,1,3-tris-(2-methyl-4-hydroxyl-5-t-butyl phenyl) butane etc., piperidin-1-oxyls such as 4-hydroxy-2,2,6,6-tetramethylpiperidine 1-oxyl, 4-oxo-2,2,6,6-tetramethylpiperidine-1-oxyl, 4-methoxy-2,2,6,6-tetramethylpiperidine-1-oxyl, 4-carboxy-2,2,6,6-tetramethylpiperidine-1-oxyl, 2,2,6,6-tetramethylpiperidine-1-oxyl etc. By using these, thickening in the middle of filling at the time of molding can be suppressed, and a radical polymerizable composition having a low melt viscosity can be obtained. These may be used by itself or in combination of two or more.

In the crystalline radical polymerizable composition for sealing the electrical and electronic component of the present invention, a reinforcing material can be blended. By using a reinforcing material, it is possible to obtain a crystalline radical polymerizable composition for sealing the electrical and electronic component having excellent strength characteristics and dimensional stability.

As a reinforcing material used in the present invention, glass fibers generally used for fiber reinforced plastics such as BMC (bulk molding compound) and SMC (sheet molding compound) etc., are used, but material is limited to glass fibers, and other materials can also be used.

As glass fiber, mention may be made of E glass (alkali-free glass for electricity), C glass (alkali-containing glass for chemistry), A glass (glass for acid resistance), S glass (high-strength glass) which uses silica glass and borosilicate glass as raw materials, and those made of long fibers (roving), short fibers (chopped strands) and milled fibers can be used. Furthermore, these glass fibers after surface treatment can also be used.

Moreover, it is possible to formulate other inorganic filler appropriately to the crystalline radical polymerizable composition for sealing the electrical and electronic component according to the present invention in a range keeping features such as a flowability of a composition or a characteristics when it is molded to obtain a sealing material.

As these type of other inorganic filler, mention may be made of an empty particle such as an oxide or hydrate thereof, an inorganic bubble particle, a silica balloon etc.

It is possible to use a release mold agent in the crystalline radical polymerizable composition for sealing the electrical and electronic component according to the present invention. As a mold release agent, mention may be made of waxes such as fatty acid type, fatty acid metal salt type, mineral type etc., which is generally used for a thermosetting resin, in particular, it is possible to preferably use those of fatty acid type, fatty acid metal salt type and waxes which is superior for a heat discoloration resistance.

As these mold release agent, specifically mention may be made of stearic acid, zinc stearate, aluminum stearate, calcium stearate and paraffin wax etc. These mold release agent may be used by itself or by the combination of two or more thereof.

As the mold release agent, it is possible to use a mold release agent of a type to be sprayed or applied to a mold as needed, or an external mold release agent such as a molding material compounded with the mold release agent.

In the present invention, other than these components, according to need, it is possible to accordingly formulate a curing catalyst, a polymerization inhibitor, a colorant, a thickener, a wetting dispersant, a surface conditioner, a viscosity reducing agent, a flow modifier, other organic series additives, inorganic series additives and the like can be appropriately blended, in order to control a curing condition of the crystalline radical polymerizable composition.

<A Method of Producing the Crystalline Radical Polymerizable Composition>

The crystalline radical polymerizable composition for sealing the electrical and electronic component according to the present can be manufactured by formulating each components to mix it adequately and uniformly by using a mixer, a blender and after that, to control and granulate by using a mixer, an extruder capable of applying heat and pressure.

In addition, the granular material, the powder and the tablet of the present invention are characterized by consisting of the crystalline radical polymerizable composition for sealing the electric and electronic component of the present invention. The granular material made of the crystalline radical polymerizable composition for sealing the electrical and electronic component of the present invention may be in the form of pellets.

Further, a sealed body of the electric and electronic component of the present invention is characterized in that the granular material, the powder and the tablet made of the crystalline radical polymerizable composition for sealing the electric and electronic component of the present invention are molded and sealed. The sealed body of the electric and electronic component can be molded by a molding method of various thermosetting compositions by a conventional method.

Moreover, since the crystalline radical polymerizable composition for sealing the electrical and electronic component of the present invention is dry and has good thermal stability at the time of melting, as a molding method, a melt-heat molding method such as an injection molding method, an injection compression molding method, a transfer molding, or a compression molding method can be suitably used.

Among them, the injection molding method using an injection molding machine and the transfer molding method using a transfer molding machine are particularly preferable, and the molding time can be shorter by the injection molding method, and many molding body can be molded at once by the transfer molding method. Thus, it is possible to manufacture a sealed body of the electrical and electronic component having a complicated shape.

<A Sealed Body of the Electric and Electronic Component and a Method of Producing a Sealed Body of the Electric and Electronic Component>

The sealed body of the electric and electronic component of the present invention can be manufactured by sealing the electric and electronic component by the insert molding method using the crystalline radical polymerizable composition for sealing the electric and electronic component of the present invention. At this moment, the crystalline radical polymerizable composition for sealing the electrical and electronic component of the present invention may be one in which all components constituting the crystalline radical polymerizable composition may be separately heated and kneaded previously. In addition, the crystalline radical polymerizable composition for sealing the electrical and electronic component of the present invention may be one in which a part or all of components constituting the crystalline radical polymerizable composition may be mixed and heated and kneaded immediately before mold injection.

The temperature and pressure of the crystalline radical polymerizable composition at the time of a mold injection are not particularly limited, but when an injection molding machine is used, it is preferable that the temperature of the crystalline radical polymerizable composition is 60 to 130° C., the mold temperature is 130 to 190° C., crystalline radical polymerizable composition pressure is 0.1 to 10 MPa, and in the case of the transfer molding machine, it is preferable that a mold temperature is 130 to 190° C., a crystalline radical polymerizable composition pressure is 0.1 to 10 MPa, in order to reduce a damage to the electrical and electronic component.

Next, an example of the crystalline radical polymerizable composition for the electric and electronic component of the present invention will be described as follows.

A crystalline radical polymerizable composition for an electrical and electronic component is characterized by comprising at least a crystalline radical polymerizable compound, an inorganic filler, a silane coupling agent, and a radical polymerization initiator. This is because the use of the crystalline radical polymerizable composition can realize a polymerizable composition having an excellent in thermal conductivity and an excellent in handling as shown in Examples described later. Moreover, in the specification, the crystalline radical polymerizable composition for the electrical and electronic component may be called a crystalline radical polymerizable composition.

Further, in a preferred embodiment of the above mentioned crystalline radical polymerizable composition for an electrical and electronic component according to the present invention, it is characterized in that a coefficient of thermal conductivity of the molded body obtained by molding the crystalline radical polymerizable composition for electric and electronic component is 1.0 W/m·K or more. The above range is set because from the viewpoint of heat dissipation, if it is less than 1.0 W/m·K, the thermal conductivity is low, there is a possibility that the electric and electronic components store heat and cause an operation failure. In the past, in order to increase the thermal conductivity, generally a thermally conductive filler with irregularities was used, but the molding material having a high thermal conductivity has a low flowability because it contains a large amount of the thermally conductive filler. Therefore, there is a problem that the application is limited and the price tends to be high. However, according to the present invention, it has been found that a sufficiently high thermal conductivity can be obtained, the flowability is good, and the handleability is excellent.

Further, in a preferred embodiment of the above mentioned crystalline radical polymerizable composition for an electrical and electronic component according to the present invention, it is characterized in that the crystalline radical polymerizable compound comprises one or more selected from unsaturated polyester, epoxy (meth) acrylate, urethane (meth) acrylate, polyester (meth) acrylate, polyether (meth) acrylate, radical polymerizable monomer, and radical polymerizable polymer.

Although the crystallinity is omitted, specifically, the crystalline radical polymerizable compound can comprise at least one selected from a crystalline unsaturated polyester, a crystalline epoxy (meth) acrylate, a crystalline urethane (meth) acrylate, a crystalline polyester (meth) acrylate, a crystalline radically polymerizable monomer, and a crystalline radically polymerizable polymer. When these polymerizable compounds are used, mechanical properties and handleability become good (also in the following, crystalline may be omitted).

Moreover, in the present specification, a crystalline compound including the above mentioned crystalline radical polymerizable compound can be a compound having a glass transition point and a melting point. These temperatures can be confirmed by a thermal analyzer such as DSC (a differential scanning calorimeter), TGDTA (a thermal gravimetric-differential thermal analyzer) or the like. The crystalline compound in the present invention can be a compound whose melting point can be confirmed by a thermal analyzer.

Further, in a preferred embodiment of the above mentioned crystalline radical polymerizable composition for an electrical and electronic component according to the present invention, it is characterized in that from a viewpoint of workability and moldability, a melting point of the crystalline radical polymerizable compound is in the range of 30 to 150° C., more preferably in the range of 30 to 120° C. This is because that the use of the crystalline radically polymerizable compound having a melting point in the range of 30 to 150° C. makes it possible to realize better handleability as compared with the case where a crystalline radical polymerizable compound having a melting point of less than 30° C., or a crystalline radical polymerizable compound having a melting point of more than 150° C. When the melting point of the crystalline radical polymerizable compound is lower than the above range, the crystalline radical polymerizable composition is likely to be in a liquid state at normal temperature, which may make it difficult for the crystalline radical polymerizable composition to maintain a solid state. If the melting point of the crystalline radical polymerizable compound is higher than the above range, since it will be close to the molding temperature of the mold, the time from the start of flow to curing will become short, and there is possibility that molding defects may occur.

Moreover, when only the crystalline radical polymerizable compound wherein a melting point is less than 30° C. is used, there is a tendency that it is difficult to become a crystalline radical polymerizable composition in a solid state at 23° C. On the other hand, when only the crystalline radical polymerizable compound having a melting point higher than 150° C. is used, since the cylinder temperature and the temperature of the mold are close when plasticizing the crystalline radical polymerizable composition in the cylinder in the injection molding method, there is a tendency that a stability becomes poor because there is a possibility that a hardening reaction proceeds in the cylinder.

Further, in a preferred embodiment of the crystalline radical polymerizable composition for the electrical and electronic component according to the present invention, from the viewpoint of the handleability of the crystalline radical polymerizable compound, the crystalline radical polymerizable composition is preferably a solid state at 23° C. The above range is set because the shape of the composition does not change in the production, molding, and transportation environment of the crystalline radical polymerizable composition, and continuous production can be performed under general-purpose production equipment and conditions. In addition, a solid state may means that a shape and a volume can not be easily changed by external force.

Further, in a preferred embodiment of the crystalline radical polymerizable composition for the electrical and electronic component of the present invention, from the viewpoint of a product quality, the inorganic filler may be 40 to 95% by weight, more preferably 50 to 93% by weight, and still more preferably 60 to 90% by weight, for total amount of the crystalline radical polymerizable composition. The above range is set because there is a possibility that when the amount of the inorganic filler is less than the above range, the shrinkage ratio is large and the molded product is deformed, and when the amount of the inorganic filler is more than the above range, the melt viscosity at the time of molding is high, so that there is a possibility that non-filling may occur, and a gas burning may occur and as a result, carbonization may occur in a part of the molded product.

Further, in a preferred embodiment of the crystalline radical polymerizable composition for the electrical and electronic component according to the present invention, the ratio of the crystalline radical polymerizable compound to the total amount of radical polymerizable compound is 25 parts by weight or more, more preferably 30 parts by weight or more, and still more preferably 35 parts by weight or more from the viewpoint of maintaining a solid state. The reason for the above range is that when the ratio of the crystalline radical polymerizable compound is smaller than the above range, there is a possibility that it may be difficult to become solid. In the case of the composition of the present invention, the degree of freedom can be increased to some extent because it is possible to achieve high viscosity. Moreover, the radical polymerizable compound may include a crystalline radical polymerizable compound and an amorphous radical polymerizable compound, and here, an example of a preferred embodiment of the ratio of the crystalline radical polymerizable compound with respect to the total amount of these radical polymerizable compounds is prescribed.

Further, in a preferred embodiment of the above mentioned crystalline radical polymerizable composition for an electrical and electronic component according to the present invention, from the viewpoint of quality control of the crystalline radical polymerizable composition, it is characterized in that the weight average molecular weight of the crystalline radical polymerizable compound may be 70 to 100,000, more preferably 100 to 50,000, and still more preferably 150 to 30,000. This is because that if the weight average molecular weight of the crystalline radical polymerizable compound is smaller than the above range, the crystalline radical polymerizable composition is unlikely to be solid, and if the weight average molecular weight of the crystalline radical polymerizable compound is larger than the above range, since the molecular weight of the crystalline radical polymerizable composition can not be controlled with high accuracy, there is a possibility that the compound characteristics and the composition characteristics may fluctuate.

Further, in a preferred embodiment of the molded body of the electric and electronic components of the present invention, it is molded by the crystalline radical polymerizable composition for the electric and electronic components of the present invention.

Further, in a preferred embodiment of the granular material of the present invention, the granular material comprises the crystalline radical polymerizable composition for an electrical and electronic component according to the present invention. Although the word "the granular material" is used, the present invention may be a powder or a tablet or a pellet and the like other than the granular material. That is, in the case of those other than the granular material (the particulate matter or granular matter), the powder, the tablet, the pellet and the like of the present invention can be composed of the crystalline radical polymerizable composition for the electrical and electronic component of the present invention.

Further, in a preferable embodiment of a method of producing a molded body of an electrical and electronic component according to the present invention, it comprises a step of molding the granular material comprising the crystalline radical polymerizable composition for an electrical and electronic component according to the present invention by means of any one of an injection molding method, a transfer molding method, a compression molding method or a hot melt molding method to obtain the molded body of the electrical and electronic component. By the injection molding method, the molded body can be produced in a short time and a large amount of products can be obtained at one time by the transfer molding method.

The molded body of the electrical and electronic component of the present invention includes an inserted substance. The molded body of the electric and electronic component can be an inserted molded body in which is used for a case of the electric and electric parts, a metal of the electric and electric parts, and/or a coil of the electric and electric parts. There is a possibility that the electric and electronic components may be damaged due to the flow pressure of the injection molding or the transfer molding using a molding material having a high viscosity. In the present invention, the electric and electronic components (parts) can include semiconductors and the like in addition to so-called electric and electronic components or parts. Therefore, these molded body of the electric and electronic component can also be used for semiconductor encapsulations. In short, the composition of the present invention can be widely applied to molded articles that require high thermal conductivity, handling, and the like.

A composition having a low melt viscosity and good fluidity has a possibility of causing a problem in handleability because the composition is soft even at normal temperature. In addition, there is a possibility that the soft composition becomes a block, and in the injection molding method, the fusion of the composition occurs in the hopper, and in the transfer molding method, the tablet molded in advance is fused and further, the shape change occurs and a problem that the molded tablet does not enter into the insertion hole of the tablet in the transfer molding machine may occur. The present invention achieves excellent effects having high productivity by achieving both fluidity and handleability.

<A Method of Producing an Unsaturated Polybasic Acid>

An unsaturated polyester used for the present invention, as an example, can be obtained by reacting with an unsaturated polybasic acid, a saturated polybasic acid and glycols according to a known dehydration condensation reaction, and thereby having an acid value of 2 to 40 mg-KOH/g generally. It is possible to obtain an unsaturated polyester having a crystallinity by selecting an acid component or a combination of an unsaturated polybasic acid, a saturated polybasic acid, and selecting or a combination of glycols, and selecting a ratio of formulation thereof accordingly in a manufacture of an unsaturated polyester.

As an unsaturated polybasic acid, mention may be made of maleic acid, maleic anhydride, fumaric acid, citraconic acid, mesaconic acid, itaconic acid, tetrahydrophthalic acid, tetrahydrophthalic anhydride, methyltetrahydrophthalic anhydride, glutaconic acid etc.

As a saturated polybasic acid, mention may be made of phthalic acid, phthalic anhydride, isophthalic acid, terephthalic acid, succinic acid, adipic acid, sebacic acid, azelaic acid, tetrahydrophthalic anhydride, methyltetrahydrophthalic anhydride, endo methylene-tetra-hydro phthalic anhydride, HET acid, tetrabromophthalic anhydride, 1,4-cyclohexanedicarboxylic acid, 2,6-naphthalenedicarboxylic acid, 1,4-naphthalenedicarboxylic acid, 2,3-naphthalene dicarboxylic acid 1,5-naphthalenedicarboxylic acid, 1,8-Naphthalene dicarboxylic acid etc.

As glycols, mention may be made of ethylene glycol, 1,3-propanediol, 1,4-butanediol, 1,5-pentanediol, 1,6-hexanediol, 1,8-octanediol, propylene glycol, diethylene glycol, triethylene glycol, dipropylene glycol, neopentyl glycol, 1,3-butanediol, hydrogenated bisphenol-A, bisphenol-A propylene oxide adduct compound, cyclohexanedimethanol, dibromo neopentyl glycol, isosorbide, isomanide, tricyclodecane dimethanol, etc.

In the present invention, among a crystalline unsaturated polyester, an unsaturated polyester is preferable wherein fumaric acid is used as an unsaturated polybasic acid, isophthalic acid or terephthalic acid is used as a saturated polybasic acid, ethylene glycol, 1,3-propanediol, 1,4-butanediol, 1,5-pentanediol, 1,6-hexanediol, 1,8-octanediol, 1,4-cyclohexanedimethanol are used as a primary component of glycol.

<A Method of Producing an Epoxy (Meth) Acrylate>

The epoxy (meth) acrylates used in the present invention can be prepared in a manner known per se. The epoxy (meth) acrylates having crystallinity can be obtained by appropriately selecting an epoxy resin and an unsaturated basic acid in the presence or absence of a known inhibitor, a known esterification catalyst, under the conditions in an inert gas stream or in an air atmosphere. If necessary, other radical polymerizable monomers and organic solvents can be added and reacted for the purpose of lowering the melt viscosity of the reaction system.

An epoxy (meta) acrylate in the present invention, as an example, can be an epoxy (meta) acrylate having a double bond of an acrylate or a methacrylate at the end of molecule obtained by the addition reaction of acrylic acid or methacrylic acid to an epoxy resin having two or more of glycidyl ether groups in one molecule. An epoxy (meta) acrylate can be an epoxy (meta) acrylate resin wherein epoxy acrylate is melted to a radical polymerizable monomer and/or a radical polymerizable prepolymer. As the above epoxy resin having two or more of glycidyl ether group in one molecule, for example, mention may be made of epoxy resin such as a bisphenol type of epoxy resin derived from bisphenol A, bisphenol F, bisphenol S etc., or these derivative, a bixylenol type of epoxy resin derived from bixylenol or the derivative thereof, a biphenol type of epoxy resin derived from biphenol or the derivative thereof, or naphthalene type of epoxy resin derived from naphthalene or the derivative thereof, novolak type of epoxy resin and further aliphatic epoxy resin etc. There can be used by itself or the combination of two or more. The epoxy equivalent which becomes a standard of the molecular weight of the epoxy resin is preferably 125 to 4,000 eq/g.

<A Method of Producing a Urethane (Meta) Acrylate>

Moreover, urethane (meta) acrylate in the present invention, as an example, can be a urethane acrylate having a double bond of acrylate or methacrylate at the end of molecule obtained by reacting polyalcohol and/or polyester polyol and/or polyether polyol having two or more of hydroxyl groups in one molecule with diisocyanate to add isocyanate groups at the end of molecule and/or one or more of isocyanate groups in one molecule to react these isocyanate groups with a compound having an alcoholic hydroxyl group and one or more of acrylate groups or methacrylate groups, or by reacting a compound having an alcoholic hydroxyl group and one or more of acrylate groups or methacrylate groups with isocyanate firstly so as to maintain isocyanate group, and then by reacting a remaining isocyanate groups with polyalcohol and/or polyester polyol and/or polyether polyol having two or more of hydroxyl groups in one molecule. In the production of urethane (meth) acrylate, it is possible to obtain a urethane (meth) epoxy acrylate which has crystallinity, by appropriately selecting a combination of isocyanate, polyalcohol and/or polyester polyol and/or polyether polyol, and a compound having alcoholic hydroxyl group and one or more acrylate group or methacrylate group. It may be urethane (meth) acrylate resin obtained by dissolving urethane acrylate or urethane methacrylate to a radical polymerizable monomer and/or a radical polymerizable polymer such as styrene, diethylene glycol dimethacrylate. These may be used by itself or by the combination of two or more thereof.

As an example of the compound having the alcoholic hydroxyl group and one or more acrylate groups or methacrylate groups, hydroxyethyl (meth) acrylate, 2-hydroxypropyl (meth) acrylate, 2-hydroxybutyl (meth) acrylate, phenoxyhydroxypropyl (meth) acrylate, trimethylolpropane di(meth) acrylate, dipropylene glycol mono(meth) acrylate and the like can be used.

Also, as an example of the polyalcohol having two or more hydroxyl groups in one molecule, neopentyl glycol, ethylene glycol, 1,3-propanediol, 1,2-butanediol, 1,3-butanediol, 1,4-butanediol, 1,5-pentanediol, 1,6-hexanediol, 1,7-heptanediol, 1,8-octanediol, 1,9-nonanediol, 1,10-decanediol, propylene glycol, diethylene glycol, dipropylene glycol, trimethylene glycol, hydrogenated bisphenol A, bisphenol A ethylene oxide adduct, bisphenol A propylene oxide adduct and the like can be used by itself or by the combination of two or more thereof. Also, as an example of the polyester polyols having two or more hydroxyl groups in one molecule, saturated polyester polyol having a molecular weight of 400 to 2,000 obtained from the dehydration condensation reaction of a polyalcohol such as neopentyl glycol, ethylene glycol, propylene glycol, diethylene glycol, dipropylene glycol, trimethylene glycol, hydrogenated bisphenol A, bisphenol A ethylene oxide adduct, bisphenol A propylene oxide adduct with a polybasic acid such as adipic acid, (anhydride) phthalic acid, isophthalic acid, terephthalic acid and trimellitic acid can be used by itself or by the combination of two or more thereof. Also, as an example of the polyether polyol having two or more hydroxyl groups in one molecule, polyethylene glycol or polypropylene glycols having a molecular weight of 300 to 4,000 obtained by ring-opening reaction of ethylene oxide or propylene oxide, or polycaprolactone etc., obtained by ring-opening reaction of caprolactone can be used by itself or by the combination of two or more thereof.

As an example of the isocyanate compound having two or more isocyanate groups in one molecule, an aromatic and/or an aliphatic isocyanate compound can be used. For example, mention may be made of tolylene diisocyanate, diphenylmethane diisocyanate, hydrogenated diphenylmethane diisocyanate, 1,6-hexamethylene diisocyanate, isophorone diisocyanate, xylylene diisocyanate, hydrogenated xylylene diisocyanate, trifunctional isocyanate in which bifunctional isocyanate compounds have trimer isocyanurate rings, biuret, adducts, and a commercially available isocyanate prepolymers modified with polyol etc. These can be used alone or in combination of two or more.

<A Method of Producing a Polyester (Meth) Acrylate>

Further, the polyester (meth) acrylate in the present invention, for example, can be polyester acrylate or a polyester methacrylate having double bonds of acrylate or methacrylate at the molecular terminal obtained by an esterification of polyester polyol with acrylic acid or methacrylic acid, or a reaction of acid-terminated polyester with acrylate or methacrylate having a glycidyl group. In the production of polyester (meth) acrylate, it is possible to obtain a polyester (meth) acrylate which has crystallinity, by appropriately selecting a combination of polyester polyol and acrylic acid or methacrylic acid, or a combination of acid-terminated polyester and acrylate or methacrylate having a glycidyl group. It may be polyester acrylate resin or polyester methacrylate resin obtained by dissolving polyester acrylate or polyester methacrylate to a radical polymerizable monomer and/or a radical polymerizable polymer such as styrene, diethylene glycol dimethacrylate etc. These may be used by itself or by the combination of two or more thereof.

<A Method of Producing a Polyether (Meth) Acrylate>

Further, the polyether (meth) acrylate in the present invention, for example, can be polyether acrylate or a polyether methacrylate having double bonds of acrylate or methacrylate at the molecular terminal obtained by an esterification of polyether polyol with acrylic acid or methacrylic acid, or a reaction of acid-terminated polyether with acrylate or methacrylate having a glycidyl group. In the production of polyether (meth) acrylate, it is possible to obtain a polyether (meth) acrylate which has crystallinity, by appropriately selecting a combination of polyether polyol and acrylic acid or methacrylic acid, or a combination of acid-terminated polyether and acrylate or methacrylate having a glycidyl group. It may be polyether acrylate resin or polyether methacrylate resin obtained by dissolving polyether acrylate or polyether methacrylate to a radical polymerizable monomer and/or a radical polymerizable polymer such as styrene, diethylene glycol dimethacrylate etc. These may be used by itself or by the combination of two or more thereof.

Further, in a preferred embodiment, the crystalline radical polymerizable monomer of the present invention which is solid state at 30 to 150° C. can include one or more selected from ethoxylated isocyanuric acid triacrylate (melting point: about 50° C.), polyethylene glycol di(meth) acrylate (melting point: 35 to 53° C.), methoxypolyethylene glycol (meth)

acrylate (melting point: 33 to 40° C.), behenyl acrylate (melting point: 46° C.), tetramethyl piperinidyl methacrylate (melting point: 56 to 60° C.), trimethallyl isocyanurate (melting point: 83 to 87° C.), diacetone acrylamide (melting point: about 56° C.), itaconic acid dimethyl ester (melting point: 36° C.), vinyl stearate (melting point: 36° C.), N-vinylcarbazole (melting point: 67° C.), N-methylol acrylamide (melting point: 71 to 75° C.), acrylamide (melting point: 84° C.), tolylene allyl carbamate (melting point: 85 to 110° C.), maleimide (melting point: 93° C.) and acenaphthylene (melting point: 95° C.). When these crystalline radical polymerizable compounds are used, the handleability can be improved.

As the radical polymerizable monomer in the present invention, a radical polymerizable monomer which is liquid state at normal temperature can be used as long as the object of the invention is not impaired. For example, mention may be made of styrene monomers having a vinyl group, vinyl aromatic compounds such as α-methylstyrene, vinyl toluene, α-chlorostyrene and the like; vinyl esters such as vinyl acetate, vinyl propionate, vinyl lactate, vinyl butyrate, veova monomer (manufactured by Shell Chemical Co., Ltd.), etc.; (meth) acrylic esters such as methyl acrylate, ethyl acrylate, n-butyl acrylate, methyl methacrylate, ethyl methacrylate, n-butyl methacrylate and the like.

Further, bifunctionals or more of the radical polymerizable monomers such as triallyl cyanurate, diethylene glycol dimethacrylate, diallyl tetrabromophthalate, phenoxyethyl acrylate, 2-hydroxyethyl acrylate, 1,6-hexanediol diacrylate, diallyl phthalate, diallyl maleate, diallyl fumarate, triallyl isocyanurate having allyl group etc., can be used. These radical polymerizable monomers may be used by itself or in combination of two or more.

As the radical polymerizable polymer in the present invention, diallyl phthalate prepolymer, TAIC™ prepolymer, epoxy prepolymer, urethane prepolymer, acrylate prepolymer may be used. These radical polymerizable polymer may be used by itself or in combination of two or more.

In the crystalline radical polymerizable composition for the electrical and electronic component of the present invention, an inorganic filler can be blended. As an example of the inorganic filler, mention may be made of calcium carbonate, magnesium carbonate, barium carbonate, calcium hydroxide, aluminum hydroxide, magnesium hydroxide, magnesium oxide, alumina, silica, zinc oxide, mica, talc, aluminum nitride and boron nitride. Among them, alumina, magnesium oxide are preferable from the viewpoint of thermal conductivity. These may be used by itself or in combination of two or more. According to the present invention, a relatively high thermal conductivity can be achieved because it is possible to realize a composition capable of blending a large amount of usable inorganic filler in consideration of cost-effectiveness. In fact, although it has the advantages that if special and expensive inorganic fillers (aluminum nitride, boron nitride), carbon nanotubes, diamond, metal powder, etc. are used, high thermal conductivity becomes possible and usable to attain a good handling and flowability, since an expensive inorganic fillers such as carbon nanotubes and metal powders are impractical, so that alumina, magnesium oxide, etc., can be used.

The inorganic filler wherein the average particle diameter of the inorganic filler is within a range of 150 μm or less, preferably within a range from 0.01 to 80 μm can be used. The use of the inorganic filler having the above range of the average particle diameter makes it possible to obtain the crystalline radical polymerizable composition for the electrical and electronic component having a superior flowability for molding, a superior strength. Further, the reason for the above range is that a thermal conductive material tends to become more advantageous when using a large inorganic filler. When a large amount of inorganic filler having a small average particle diameter is used, since the resin has low coefficient of thermal conductivity, so that it causes thermal resistance, which may lower the coefficient of thermal conductivity of the molded article. Therefore, although using an inorganic filler with a large average particle size is advantageous for thermal conduction, there is a possibility that an inorganic filler that is too large may have an appearance (surface unevenness) and may not be able to be filled in fine parts. From such a point of view, it can be narrowed down to a certain size.

Moreover, the average particle diameter is measured by a laser diffraction method, and the JIS standard is a JIS Z 8825-1. Incidentally, this JIS Z 8825-1 has been abolished in 2013 Dec. 20 (H25.12.20) and replaced with JIS Z 8825. And JIS Z 8825-1 means a particle diameter analysis-laser diffraction method.

In the crystalline radical polymerizable composition for the electrical and electronic component of the present invention, a various sort of additives in close contact with an inorganic filler, a reinforcing material, for example, a (meth) acrylate compound having a polar group and a coupling agent can be blended.

The (meth) acrylate compound having a polar group is not particularly limited, and examples thereof may include (meth) acrylate compounds in which a substituent group containing an atom other than carbon and hydrogen is ester-linked. As examples of the substituent group, mention may be made of a hydroxyl group and epoxy groups, glycidyl ether group, tetrahydrofurfuryl group, isocyanate group, carboxyl group, alkoxysilyl group, phosphoric acid ester group, lactone group, oxetane group, tetrahydropyranyl group, amino group and the like. The coupling agent is not particularly limited, and for example, a silane series coupling agent or a titanate series coupling agent can be used. As the silane series coupling agent, for example, an epoxysilane series, an aminosilane series, a cationic silane series, a vinylsilane series, an acrylsilane series, a mercaptosilane series, and a composite system of these can be used.

Among these, acrylic silane series coupling agents are preferable from the viewpoint of strength improvement. Besides, any additives can be used as long as the object of the present invention is not impaired.

In the crystalline radically polymerizable composition for the electrical and electronic component of the present invention, as a radical polymerization initiator, an organic peroxide, a polymerization inhibitor which is generally used for an unsaturated polyester resin composition or a radical polymerizable composition, can be used.

As organic peroxides, mention may be made of t-butylperoxy-2-ethylhexyl monocarbonate, 1,1-di(t-hexylperoxy) cyclohexane, 1,1-di(t-hexylperoxy) cyclohexane, 1,1-di(t-butylperoxy) cyclohexane, 1,1-di(t-butylperoxy)-3,3,5-trimethylcyclohexane, t-butylperoxy octoate, benzoyl peroxide, methyl ethyl ketone peroxide, acetylacetone peroxide, t-butylperoxybenzoate, dicumyl peroxide and the like. These may be used by itself or in combination of two or more.

Among them, from a viewpoint of molding conditions and stability of storage, the use of organic peroxide wherein the 10 hours half-life temperature is 90° C. or more, is preferable, and specifically dicumyl peroxide can be used preferably.

As a polymerization inhibitor, mention may be made of quinones such as hydroquinone, monomethyl ether hydroquinone, toluhydroquinone, di-t-4-methylphenol, monomethyl ether hydroquinone, phenothiazine, t-buthyl catechol, parabenzoquinone, pyrogallol etc., a phenolic series compound such as 2,6-di-t-butyl-cresol, 2,2-methylene-bis-(4-methyl-6-t-butyl phenol), 1,1,3-tris-(2-methyl-4-hydroxyl-5-t-butyl phenyl) butane etc., piperidin-1-oxyls such as 4-hydroxy-2,2,6,6-tetramethylpiperidine 1-oxyl, 4-oxo-2,2,6,6-tetramethylpiperidine-1-oxyl, 4-methoxy-2,2,6,6-tetramethylpiperidine-1-oxyl, 4-carboxy-2,2,6,6-tetramethylpiperidine-1-oxyl, 2,2,6,6-tetramethylpiperidine-1-oxyl etc. By using these, thickening in the middle of filling at the time of molding can be suppressed, and a radical polymerizable composition having a low melt viscosity can be obtained. These may be used by itself or in combination of two or more.

In the crystalline radical polymerizable composition for the electrical and electronic component of the present invention, a reinforcing material can be blended. By using a reinforcing material, it is possible to obtain a crystalline radical polymerizable composition for the electrical and electronic component having excellent strength characteristics and dimensional stability.

As a reinforcing material used in the present invention, glass fibers generally used for fiber reinforced plastics such as BMC (bulk molding compound) and SMC (sheet molding compound) etc., are used, but material is limited to glass fibers, and other materials can also be used.

As glass fiber, mention may be made of E glass (alkali-free glass for electricity), C glass (alkali-containing glass for chemistry), A glass (glass for acid resistance), S glass (high-strength glass) which uses silica glass and borosilicate glass as raw materials, and those made of long fibers (roving), short fibers (chopped strands) and milled fibers can be used. Furthermore, these glass fibers after surface treatment can also be used.

Moreover, it is possible to formulate other inorganic filler appropriately to the crystalline radical polymerizable composition for sealing the electrical and electronic component according to the present invention in a range keeping characteristics when it is molded to obtain a molded body.

As these type of other inorganic filler, mention may be made of an empty particle such as an oxide or hydrate thereof, an inorganic bubble particle, a silica balloon etc.

Further, in the crystalline radical polymerizable composition for the electric and electronic parts of the present invention, a thermoplastic resin can be appropriately blended within a range that does not impair the properties of the molded product.

These include thermoplastic resins such as polystyrene, acrylic resin, polyvinyl acetate, saturated polyester, styrene-butadiene series rubber, and organic foamed particles.

It is possible to use a release mold agent in the crystalline radical polymerizable composition for the electrical and electronic component according to the present invention. As a mold release agent, mention may be made of waxes such as fatty acid type, fatty acid metal salt type, mineral type etc., which is generally used for a thermosetting resin, in particular, it is possible to preferably use those of fatty acid type, fatty acid metal salt type and waxes which is superior for a heat discoloration resistance.

As these mold release agent, specifically mention may be made of stearic acid, zinc stearate, aluminum stearate, calcium stearate and paraffin wax etc. These mold release agent may be used by itself or by the combination of two or more thereof.

As the mold release agent, it is possible to use a mold release agent of a type to be sprayed or applied to a mold as needed, or an external mold release agent such as a molding material compounded with the mold release agent.

A flame retardant can be used in the crystalline radical polymerizable composition for the electric and electronic component of the present invention. As the flame retardant, it is possible to use organic type flame retardant such as halogen type, phosphorus type, nitrogen type, composite type, and inorganic type flame retardant such as a metal hydroxide, antimony type, red phosphorus type, silicone type, borate. Furthermore, as these flame retardants, additive type of flame retardants and reactive type of flame retardants that react with the resin and are incorporated into the resin skeleton can also be used. These flame retardants may be used alone or in combination of two or more.

In the present invention, other than these components, according to need, it is possible to accordingly formulate a curing catalyst, a polymerization inhibitor, a colorant, a thickener, a wetting dispersant, a surface conditioner, a viscosity reducing agent, a flow modifier, other organic series additives, inorganic series additives and the like can be appropriately blended, in order to control a curing condition of the crystalline radical polymerizable composition.

<A Method of Producing the Crystalline Radical Polymerizable Composition>

The crystalline radical polymerizable composition for the electrical and electronic component according to the present can be manufactured by formulating each components to mix it adequately and uniformly by using a mixer, a blender and after that, to control and granulate by using a mixer, an extruder capable of applying heat and pressure.

Further, the granular material of the present invention is characterized by comprising the crystalline radical polymerizable composition for an electrical and electronic component according to the present invention.

Further, the molded body of the electric and electronic component of the present invention is characterized in that the molded body is molded by using a granular material made of the crystalline radically polymerizable composition for the electric and electronic component of the present invention. The molded body of the electric and electronic component can be molded by a method of molding various thermosetting compositions by a conventional method.

Moreover, since the crystalline radical polymerizable composition for the electrical and electronic component of the present invention is dry and has good thermal stability at the time of melting, as a molding method, a melt-heat molding method such as an injection molding method, an injection compression molding method, a transfer molding, a compression molding method or a hot melt molding method can be suitably used.

Among them, the injection molding method using an injection molding machine and the transfer molding method using a transfer molding machine are particularly preferable, and the molding time can be shorter by the injection molding method, and many molding body can be molded at once by the transfer molding method. Thus, it is possible to manufacture a molded body of the electrical and electronic component having a complicated shape.

<A Molded Body of the Electric and Electronic Component and a Method of Producing a Molded Body of the Electric and Electronic Component>

The molded body of the electric and electronic component of the present invention can be manufactured by molding the molded body of the electric and electronic component using the crystalline radical polymerizable composition for the electric and electronic component of the present invention. At this moment, the crystalline radical polymerizable composition for the electrical and electronic component of the present invention may be one in which all components constituting the crystalline radical polymerizable composition may be separately heated and kneaded previously. In addition, the crystalline radical polymerizable composition for the electrical and electronic component of the present invention may be one in which a part or all of components constituting the crystalline radical polymerizable composition may be mixed and heated and kneaded immediately before mold injection.

The temperature and pressure of the crystalline radical polymerizable composition at the time of a mold injection are not particularly limited, but when an injection molding machine is used, it is preferable that the temperature of the crystalline radical polymerizable composition is 60 to 130° C., the mold temperature is 130 to 190° C., crystalline radical polymerizable composition pressure is 0.1 to 10 MPa, and in the case of the transfer molding machine, it is preferable that a mold temperature is 130 to 190° C., a crystalline radical polymerizable composition pressure is 0.1 to 10 MPa, in order to reduce a damage to the electrical and electronic component.

EXAMPLE

As mentioned below, an embodiment of the present invention will be concretely explained in more detail with reference to Examples, but the invention is not intended to be interpreted as being limited to Examples.

<Examples of Manufacturing the Crystalline Radical Polymerizable Composition for Sealing the Electric and Electronic Component>

Examples 1 to 11, Reference Example 1 and Comparative Examples 1 to 2

The crystalline or non-crystalline (amorphous) radical polymerizable compositions of Examples 1 to 11 and Reference Examples 1 which are shown in Table 2 and the non-crystalline radical polymerizable compositions of Comparative Examples 1 to 2 shown in Table 3, were formulated with the formulation amounts described in the following Tables 2 and 3, and prepared uniformly using a neader capable of heating, pressuring and cooling and after that, the prepared mixture was fed into the extruder and hot cut to form a granular material. Some of the granular material and bulk radical polymerizable composition were powdered using a grinder.

The obtained radical polymerizable composition was molded to a mold temperature of 165° C., a curing time of 180 seconds, or a time for which a test piece can be obtained, using a hydraulic forming machine (manufactured by Toho Press Co., Ltd.) to produce a test piece. The physical properties of the molded test pieces were evaluated by the methods described below, and the results are shown in Tables 2 and 3, respectively.

The following components of the formulation were used.

(1) A polymerizable compound
1. A crystalline radical polymerizable compound 1: Phthalic acid based unsaturated polyester (condensate of terephthalic acid and fumaric acid with 1,6-hexanediol)
2. A crystalline radical polymerizable compound 2: Urethane methacrylate (2-hydroxyethyl methacrylate adduct of 1,6-hexamethylene diisocyanate)
3. A crystalline radical polymerizable compound 3: Urethane acrylate (2-hydroxyethyl acrylate adduct of 1,6-hexamethylene diisocyanate)
4. A crystalline radical polymerizable monomer 1: Ethoxylated isocyanuric acid triacrylate (manufactured by Shin-Nakamura Chemical Co., Ltd. A-9300)
5. An amorphous radical polymerizable compound 1: Phthalic acid based unsaturated polyester (8552H, manufactured by Japan U-Pica Company, Ltd.)
6. An amorphous radical polymerizable compound 2: Bisphenol A type epoxy methacrylate (methacrylic acid adduct of bisphenol A epoxy resin)
7. A radical polymerizable monomer 1: Diallyl phthalate monomer (Daisodapu monomer, manufactured by Osaka Soda Co., Ltd.)
8. A radical polymerizable monomer 2: Diethylene glycol dimethacrylate (2G, manufactured by Shin-Nakamura Chemical Co., Ltd.)

(2) An inorganic filler
1. An inorganic filler 1: Fused silica (manufactured by Denka Co., Ltd., average particle size 24 μm)
2. An inorganic filler 2: Calcium carbonate (manufactured by Nitto Powder Co., Ltd., average particle size 2 μm)

(3) An additive agent
1. A silane coupling agent: Methacrylic based silane (KBM-503, manufactured by Shin-Etsu Chemical Co., Ltd.)
2. A radical polymerization initiator: Dicumyl peroxide (Park Mill D, manufactured by NOF Corporation)
3. A mold release agent: Zinc stearate (GF-200, manufactured by NOF Corporation)
4. A polymerization inhibitor: Perabenzoquinone (PBQ, manufactured by SEIKO CHEMICAL CO., LTD.)
5. A colorant: Carbon black (CB40, manufactured by Mitsubishi Chemical Corporation)

<Characteristics of Polymerizable Compound>
The melting points and weight average molecular weights of the crystalline or amorphous radical polymerizable compound and the radical polymerizable monomer were measured and shown in Table 1.

TABLE 1

|  |  | The melting point [° C.] | The weight average molecular weight |
|---|---|---|---|
| A crystalline radical polymerizable compound 1 | Phthalic acid based unsaturated polyester | 83 | 11400 |
| A crystalline radical polymerizable compound 2 | Urethane methacrylate | 77 | 800 |
| A crystalline radical polymerizable compound 3 | Urethane acrylate | 75 | 800 |
| A crystalline radical polymerizable monomer 1 | Ethoxylated isocyanuric acid triacrylate | 55 | 600 |
| An amorphous radical polymerizable compound 1 | Phthalic acid based unsaturated polyester | — | 41700 |
| An amorphous radical polymerizable compound 2 | Bisphenol A type epoxy methacrylate | — | 3000 |
| A radical polymerizable monomer 1 | Diallyl phthalate monomer | — | 400 |
| A radical polymerizable monomer 2 | Diethylene glycol dimethacrylate | — | 400 |

TABLE 2

|  |  | Unit | Exa. 1 | Exa. 2 | Exa. 3 | Exa. 4 | Exa. 5 | Exa. 6 | Exa. 7 | Exa. 8 | Exa. 9 | Exa. 10 | Exa. 11 | Ref. 1 |
|---|---|---|---|---|---|---|---|---|---|---|---|---|---|---|
| A crystalline radical polymerizable compound 1 | Phthalic acid based unsaturated polyester | % by weight | 70 | 70 | 70 | 70 |  |  |  |  | 70 |  |  |  |
| A crystalline radical polymerizable compound 2 | Urethane methacrylate | % by weight |  |  |  |  | 70 | 50 |  |  |  | 30 | 50 |  |
| A crystalline radical polymerizable compound 3 | Urethane acrylate | % by weight |  |  |  |  |  |  | 70 |  |  |  |  |  |
| A crystalline radical polymerizable monomer 1 | Ethoxylated isocyanuric acid triacrylate | % by weight |  |  |  |  | 30 | 50 | 30 | 100 |  |  |  | 100 |
| An amorphous radical polymerizable compound 2 | Bisphenol A type epoxy methacrylate | % by weight |  |  |  |  |  |  |  |  |  |  | 50 |  |
| A radical polymerizable monomer 1 | Diallyl phthalate monomer | % by weight | 30 | 30 | 30 | 30 |  |  |  |  | 30 |  |  |  |
| A radical polymerizable monomer 2 | Diethylene glycol dimethacrylate | % by weight |  |  |  |  |  |  |  |  |  | 70 |  |  |
| An inorganic filler 1 | Fused silica | % by weight |  |  | 450 | 650 | 650 | 650 | 650 | 750 |  | 650 | 650 | 1500 |
| An inorganic filler 2 | Calcium carbonate | % by weight | 300 | 200 | 200 |  |  |  |  |  | 50 |  |  |  |
| A silane coupling agent | Methacrylic based silane | % by weight | 3 | 3 | 3 | 3 | 3 | 3 | 3 | 3 | 3 | 3 | 3 | 3 |
| A radical polymerization initiator | Dicumyl peroxide | % by weight | 1 | 1 | 1 | 1 | 1 | 1 | 1 | 1 | 1 | 1 | 1 | 1 |
| A mold release agent | Zinc stearate | % by weight | 10 | 10 | 10 | 10 | 10 | 10 | 10 | 10 | 10 | 10 | 10 | 10 |
| A polymerization inhibitor | Perabenzoquinone | % by weight | 0.1 | 0.1 | 0.1 | 0.1 | 0.1 | 0.1 | 0.1 | 0.1 | 0.1 | 0.1 | 0.1 | 0.1 |
| A colorant | Carbon black | % by weight | 0.2 | 0.2 | 0.2 | 0.2 | 0.2 | 0.2 | 0.2 | 0.2 | 0.2 | 0.2 | 0.2 | 0.2 |
| Total |  |  | 414 | 314 | 764 | 764 | 764 | 764 | 764 | 864 | 94 | 764 | 764 | 1614 |
| Hardness |  |  | 12 | 6 | 16 | 16 | 40 | 40 | 40 | 40 | 3 | 0 | 37 | 43 |
| Melt viscosity |  | Pa·s | 8 | 5 | 41 | 18 | 6 | 6 | 6 | 50 | 0.5 | 6 | 60 | 2400 |
| Flow length |  | cm | 235 | 250 or more | 160 | 140 | 95 | 100 | 100 | 90 | 250 or more | 220 | 95 | 5 |
| Shrinkage of a molded article |  | % | 1.2 | 1.7 | 0.3 | 0.1 | 0.1 | 0.1 | 0.1 | 0.1 | 1.9 | 0.0 | 0.2 | −0.1 |
| Glass transition point |  | °C. | 130 | 115 | 130 | 120 | 190 | 205 | 170 | 250 or more | 105 | 180 | 155 | 250 or more |

TABLE 3

|  |  | Unit | Com. 1 | Com. 2 |
|---|---|---|---|---|
| An amorphous radical polymerizable compound 1 | Phthalic acid based unsaturated polyester | % by weight | 70 |  |
| An amorphous radical polymerizable compound 2 | Bisphenol A type epoxy methacrylate | % by weight |  | 100 |
| A radical polymerizable monomer 1 | Diallyl phthalate monomer | % by weight | 30 |  |
| An inorganic filler 1 | Fused silica | % by weight | 650 | 650 |
| An inorganic filler 2 | Calcium carbonate | % by weight |  |  |
| A silane coupling agent | Methacrylic based silane | % by weight | 3 | 3 |
| A radical polymerization initiator | Dicumyl peroxide | % by weight | 1 | 1 |
| A mold release agent | Zinc stearate | % by weight | 10 | 10 |
| A polymerization inhibitor | Perabenzoquinone | % by weight | 0.1 | 0.1 |
| A colorant | Carbon black | % by weight | 0.2 | 0.2 |
| Total |  |  | 764 | 764 |
| Hardness |  |  | 5 | 60 |
| Melt viscosity |  | Pa·s | 500 | 3000 |
| Flow length |  | cm | 40 | 60 |
| Shrinkage of a molded article |  | % | 0.2 | 0.3 |
| Glass transition point |  | °C. | 200 | 130 |

<A Characteristic of Chemical Compound, a Characteristic of Composition and a Method of Evaluating Physical Property>

(1) A Melting Point 10 mg of a sample to be measured was placed in an aluminum pan with a radically polymerizable compound shown in Table 1 using a differential scanning calorimeter "DSC 6220" (manufactured by Seiko Instruments Inc.), and the lid was pressed to seal it from −60° C. up to 200° C., and was measured at a temperature rising rate of 10° C./min up to 200° C. The endothermic peak of the obtained curve was taken as the melting point. The results are shown in Table 1. In the case that the compound which is a liquid state at 23° C., measuring was stopped.

(2) Weight Average Molecular Weight

The weight average molecular weight of the radical polymerizable compound shown in Table 1 was measured by dissolving the polymerizable compound in tetrahydrofuran (THF) at 1.0% by weight, and measuring it by polystyrene conversion using GPC (gel permeation chromatography). The measurement conditions are shown below. The results are shown in Table 1. However, even if the above strict standard is not fulfilled, the weight average molecular weight may be less than 100 or more than 100000 since there is possibility that conditions are adopted according to a desired application and a desired quality etc., the standard may be thought that it is one of rough indication.

Equipment: Shodex GPC-101 produced by Showa Denko

Column: KF-802, 803, 804, 805 produced by Showa Denko

Solvent, carrier liquid: THF

Flow rate: 1.0 ml/min

Sample concentration: 1.0%

Temperature: 40° C.

Sample injection volume: 200 μl

Detector: Differential Refractive Index Detector (3) Hardness

The measurement method was based on JIS K 7215. The hardness of the crystalline or non-crystalline radical polymerizable composition of Examples 1 to 11 and Reference Example 1 shown in Table 2 and Comparative Examples 1 to 2 shown in Table 3 was measured by a durometer (WR-105D produced by Nishi Tokyo Seimitsu Co., Ltd.). The radical polymerizable composition whose temperature is controlled at 90° C. was formed into a flat plate of about 100 mm×100 mm×10 mm and cooled and solidified in a thermostatic chamber at 23° C. The radical polymerizable composition before curing whose temperature is controlled at 23° C., was placed on a horizontal hard table. The pressure reference surface of the durometer was pressed against the surface of the radical polymerizable composition as quickly as possible without impact while keeping parallel to the surface of the radical polymerizable composition and the pressure reference surface to adhere the pressure reference surface to the radical polymerizable composition sufficiently. The maximum indicated value of the pointer of the pointing device was read immediately within one second. The results are shown in Tables 2 and 3. The target hardness was 10, with 20 or more being excellent, 10 or more being good, and less than 10 being acceptable.

(4) Melt Viscosity

The melt viscosity of the crystalline or non-crystalline radical polymerizable composition of Examples 1 to 11 and Reference Example 1 shown in Table 2 and Comparative Examples 1 to 2 shown in Table 3 was measured with a high-performance flow tester (CFT-100 EX, manufactured by Shimadzu Corporation). A radical polymerizable composition was placed in a cylinder sample insertion hole heated to 90° C., using the tester equipped with a 0.5 mm diameter and 1 mm long die to apply a pressure of 30 kgf/cm$^2$ or 1 kgf/cm$^2$ to the piston after preheating for 240 seconds, and the radical polymerizable composition was allowed to flow out from the nozzle of the die, and the melt viscosity was determined from the point of good linearity. The results are shown in Tables 2 and 3. The target melt viscosity was 1 to 1000 Pa·s, and the composition having 1 to 100 Pa·s was excellent, and 100 to 1000 Pa·s was good.

(5) Flow Length

The measurement method meets the standard of EIMS T-901. The flow length of the crystalline or non-crystalline radical polymerizable compositions of Examples 1 to 11, Reference Example 1 shown in Table 2 and Comparative Examples 1 and 2 shown in Table 3 was measured by an auxiliary ram type of transfer molding machine equipped with a spiral flow mold. The spiral flow mold was heated to 165° C. The mold of the spiral flow which has a central portion as an injection port portion of the material and a groove having a semicircular spiral curve with a radius of 1.6 mm starting from the injection port portion, was used. A predetermined amount of radical polymerizable composition was weighed out so that the thickness of cull could be in the range of 1 to 10 mm. The plunger was raised, the radical polymerizable composition was charged into the pot, and a pressure of 3.2 MPa was immediately applied to start transfer molding. The movement of the plunger was stopped, and the mold was opened after 180 seconds from the start of measurement, and the molded body was taken out. A number of adding the length up to the glossy part of the tip of the molded body or the length of the glossy part to ½ of the length of the low density part beyond the glossy part, was read. The results are shown in Tables 2 and 3. The target flow length was 50 cm, and 100 cm or more was excellent, 50 cm or more was good, and less than 50 cm was acceptable. However, even if the above strict standard is not fulfilled, the flow length may be less than 50 cm, since there is possibility that conditions are adopted according to a desired application and a desired quality etc., the standard may be thought that it is one of rough indication.

(6) Shrinkage of a Molded Article

The measuring method meets the standard of JIS K 6911. Using the crystalline or non-crystalline (amorphous) radical polymerizable compositions of Examples 1 to 11 and Reference Examples 1 shown in Table 2, and Comparative Examples 1 and 2 shown in Table 3, test pieces were produced by compression molding the compositions with a mold for measuring a shrinkage ratio. The radical polymerizable composition was placed in a mold whose temperature is controlled at 165° C. to press and heat it for 3 minutes. The test piece was immediately removed from the mold and stored for 24 hours under constant temperature and humidity of 23° C. and humidity 55% RH. The dimensions of a total of four points including at two points on the surface and at two points on the back were measured along the measurement lines orthogonal to each other regarding the outer shapes of the annular bands protruding on the front and back of the test piece. The external shape of the groove of the mold corresponding to the test piece was measured up to 0.01 mm under the same conditions to calculate the mold shrinkage ratio. The results are shown in Tables 2 and 3. The target molding shrinkage ratio was 0.5%, 0.2% or less was excellent, 0.2 to 0.5% or less was good, and greater than 0.5% was acceptable. However, even if the above strict standard is not fulfilled, the molding shrinkage ratio may be greater than 0.5%, since there is possibility that conditions are adopted according to a desired application and a desired quality etc., the standard may be thought that it is one of rough indication.

(7) Glass Transition Point

The measurement meets the standard of JIS K 7224-4. The crystalline or non-crystalline radical polymerizable composition of Examples 1 to 11 and Reference Example 1 shown in Table 2 and Comparative Examples 1 to 2 shown in Table 3 was placed in a mold for a flat plate whose temperature is adjusted to 165° C. The mold was immediately closed and pressure and heat molding was performed. After curing, the mold was opened to obtain a flat-shaped molded piece. The flat plate-shaped molded piece was cut into a strip shape to obtain a test piece for glass transition point measurement. A dynamic viscoelasticity (RSA-G2, manufactured by TA Instruments Co., Ltd.) was measured at a temperature rising rate of 2° C./min, in the range of 30 to 250° C., at a frequency of 10 Hz. The Tan δ peak temperature was taken as the glass transition point. The results are shown in Tables 2 and 3. The target glass transition temperature was 125° C., with a temperature of 125° C. or higher being acceptable, and a temperature below 125° C. being acceptable. However, even if the above strict standard is not fulfilled, the glass transition temperature may be below 125° C., since there is possibility that conditions are adopted according to a desired application and a desired quality etc., the standard may be thought that it is one of rough indication.

<A Result of Evaluation>

As shown in Tables 2 and 3, it was found that the crystalline radical polymerizable composition for sealing the electrical and electronic components of the present invention is excellent in handleability. Further, in particular, Examples 1 to 8 and 11 of the crystalline radical polymerizable composition for sealing the electrical and electronic component of the present invention were excellent in handleability and their melt viscosity was low and good because they are solid at 23° C. It has been found that the crystalline radical polymerizable composition for sealing the electric and electronic components of the present invention shows excellent results as a whole.

A composition of Example 9 is a crystalline radical polymerizable composition in which the blending amount of the inorganic filler in Example 1 is different. The hardness of the composition was 3 and the composition was soft. Furthermore, the melt viscosity was 0.5 Pa·s, and the composition had a low viscosity, and although the shrinkage of a molded article was large, all the rest of properties were good.

A composition of Example 10 is a crystalline radical polymerizable composition wherein the blending ratio of the radical polymerizable compound is changed by changing the crystalline radical polymerizable compound of Example 5 to a radical polymerizable compound which is a liquid state at a room temperature. The composition had a hardness of 0 and was soft because the amount of the crystalline radical polymerizable compound was small. Further, the result was a low glass transition point, but all the rest of properties were good.

A composition of Reference Example 1 is a crystalline radical polymerizable composition in which the blending amount of the inorganic filler of Example 8 is changed. The melting start temperature was not observed because the flow stopped during the measurement. In addition, although the melt viscosity was high and the flow length was short, all the rest of properties were good.

Therefore, even if it is a composition of Examples 9 and 10 and Reference Example 1, since there is possibility that conditions are adopted according to a desired application and a desired quality etc., the standard may be thought that it is one of rough indication. It has been found that it is applicable to applications where good properties are required.

Further, in both Comparative Examples 1 and 2, the melt viscosity was high (comparative example 1 can be compared with Example 4) compared to the crystallin radical polymerizable composition and the result was inferior in handleability and the like.

As described above, it has been found that the crystalline radical polymerizable composition for sealing the electrical and electronic component containing at least the crystalline radical polymerizable compound, is excellent in handleability and also in flowability.

Further, in the following, one embodiment of the crystalline radical polymerizable composition for the electrical and electronic components (parts) and the like of the present invention will be described in more detail by way of examples, but the present invention is not limited to these examples.

<Examples of Manufacturing the Crystalline Radical Polymerizable Composition for the Electric and Electronic Component>

Examples 12 to 19 and Comparative examples 3 to 5 The crystalline or non-crystalline (amorphous) radical polymerizable compositions of Examples 12 to 19 and Comparative Examples 3 to 5 which are shown in Table 4, were formulated with the formulation amounts described in the following Table 4, and prepared uniformly using a neader capable of heating, pressuring and cooling and after that, the prepared mixture was fed into the extruder to form a granular material by a hot cut method. Some of the granular material and bulk radical polymerizable composition were powdered using a grinder.

The obtained radical polymerizable composition was molded to a mold temperature of 165° C., a curing time of 180 seconds, or a time for which a test piece can be obtained, using a hydraulic forming machine (manufactured by Toho Press Co., Ltd.) to produce a test piece. The physical properties of the molded test pieces (the molded body) were evaluated by the methods described below, and the results of physical property evaluation are shown in Tables 4 and 5.

The following components of the formulation were used.

(1) A Radical Polymerizable Compound

1. A crystalline radical polymerizable compound 1: Phthalic acid based unsaturated polyester (condensate of terephthalic acid and fumaric acid with 1,3-propanediol)

2. A crystalline radical polymerizable compound 2: Urethane methacrylate (2-hydroxyethyl methacrylate adduct of 1,6-hexamethylene diisocyanate)

3. An amorphous radical polymerizable compound 1: Phthalic acid based unsaturated polyester (855211, manufactured by Japan U-Pica Company, Ltd.)

4. An amorphous radical polymerizable compound 2: Bisphenol A type epoxy methacrylate (methacrylic acid adduct of bisphenol A epoxy resin)

(2) A Radical Polymerizable Monomer

5. A radical polymerizable monomer 1: Styrene monomer

6. A radical polymerizable monomer 2: Ethoxylated isocyanuric acid triacrylate (A-9300, manufactured by Shin-Nakamura Chemical Co., Ltd.)

(3) An Inorganic Filler

1. An inorganic filler 1: Aluminum oxide (manufactured by Denka Co., Ltd., average particle size 45 μm)

2. An inorganic filler 2: Magnesium oxide (manufactured by Ube Materials, Inc. Average particle size 55 μm)

3. An inorganic filler 3: Fused silica (manufactured by Denka Co., Ltd., average particle size 24 μm)

(4) An Additive Agent

1. A silane coupling agent: Methacrylic based silane (KBM-503, manufactured by Shin-Etsu Chemical Co., Ltd.)

2. A radical polymerization initiator: Dicumyl peroxide (Park Mill D, manufactured by NOF Corporation)

3. A mold release agent: Zinc stearate (GF-200, manufactured by NOF Corporation)

4. A thermoplastic resin: Polystyrene (G-100C, manufactured by Toyo polystyrene Co., Ltd.)

5. A polymerization inhibitor: Perabenzoquinone (PBQ, manufactured by SEIKO CHEMICAL CO., LTD.)

6. A colorant: Carbon black (CB40, manufactured by Mitsubishi Chemical Corporation)

TABLE 4

|  |  | Exa. 12 | Exa. 13 | Exa. 14 | Exa. 15 | Exa. 16 | Exa. 17 | Exa. 18 | Exa. 19 |
|---|---|---|---|---|---|---|---|---|---|
| A crystalline radical polymerizable compound 1 | | 50 | 60 | 60 | | | | | |
| A crystalline radical polymerizable compound 2 | | | | | 50 | 75 | 50 | 50 | 50 |
| An amorphous radical polymerizable compound 1 | | | | | | | | | |
| An amorphous radical polymerizable compound 2 | | | | | 50 | | | | |
| A radical polymerizable monomer 1 | | 50 | 40 | 40 | | | | | |
| A radical polymerizable monomer 2 | | | | | | 25 | 50 | 50 | 50 |
| An inorganic filler 1 | | 900 | | | | 1000 | 700 | | |
| An inorganic filler 2 | | 100 | 250 | 100 | 700 | | | 700 | 600 |
| An inorganic filler 3 | | | | | | | | | 100 |
| A coupling agent | | 2 | 2 | 2 | 2 | 2 | 2 | 2 | 2 |
| A mold release agent | | 14 | 14 | 14 | 14 | 14 | 14 | 14 | 14 |
| A colorant | | 8 | 8 | 8 | 8 | 8 | 8 | 8 | 8 |
| A thermoplastic resin | | 30 | | | | | | | |
| A polymerization initiator | | 3 | 3 | 3 | 3 | 3 | 3 | 3 | 3 |
| A polymerization inhibitor | | 0.1 | 0.1 | 0.1 | 0.1 | 0.1 | 0.1 | 0.1 | 0.1 |
| A melting point | [°] | 90 | 90 | 90 | 70 | 70 | 70 | 70 | 70 |
| A weight-average molecular weight | | 11400 | 11400 | 11400 | 3000 | 800 | 800 | 800 | 800 |
| A hardness | [—] | 15 | 11 | 10 | 40 | 48 | 45 | 43 | 43 |
| A coefficient of thermal conductivity | [W/m·K] | 3.6 | 1.0 | 0.4 | 4.6 | 4.7 | 4.0 | 4.6 | 3.0 |
| A melt viscosity | [Pa·s] | 1000 | 3000 | 600 | 300 | 200 | 100 | 200 | 150 |

TABLE 5

|  |  | Com. 3 | Com. 4 | Com. 5 |
|---|---|---|---|---|
| A crystalline radical polymerizable compound1 | | | | |
| A crystalline radical polymerizable compound2 | | | | |
| An amorphous radical polymerizable compound1 | | 50 | 60 | |
| An amorphous radical polymerizable compound2 | | | | 50 |
| A radical polymerizable monomer1 | | 50 | 40 | 50 |
| A radical polymerizable monomer2 | | | | |
| An inorganic filler1 | | 1000 | | 1000 |
| An inorganic filler2 | | | 100 | |
| An inorganic filler3 | | | | |
| A coupling agent | | 2 | 2 | 2 |
| A mold release agent | | 14 | 14 | 14 |
| A colorant | | 8 | 8 | 8 |
| A thermoplastic resin | | 30 | | 30 |
| A polymerization initiator | | 3 | 3 | 3 |
| A polymerization inhibitor | | 0.1 | 0.1 | 0.1 |
| A melting point | [° C.] | — | — | — |
| A weight-average molecular weight | | 41700 | 41700 | 3000 |
| A hardness | [—] | 5 | 7 | 5 |
| A coefficient of thermal conductivity | [W/m·K] | 4.7 | 0.4 | 4.7 |
| A melt viscosity | [Pa·s] | 800 | 1000 | 500 |

<A Characteristic of Chemical Compound, a Characteristic of Composition and a Method of Evaluating Physical Property>

(1) A Melting Point 10 mg of a sample to be measured was placed in an aluminum pan with a radical polymerizable compound shown in Tables 4 and 5 using a differential scanning calorimeter "DSC 6220" (manufactured by Seiko Instruments Inc.), and the lid was pressed to seal it from −60° C. up to 200° C., and was measured at a temperature rising rate of 10° C./min up to 200° C. The endothermic peak of the obtained curve was taken as the melting point. The results are shown in Tables 4 and 5. In the case that the compound which is a liquid state at 23° C., measuring was stopped.

(2) Weight Average Molecular Weight

The weight average molecular weight of the radical polymerizable compound shown in Tables 4 and 5 was measured by dissolving the radical polymerizable compound in tetrahydrofuran (THF) at 1.0% by weight, and measuring it by polystyrene conversion using GPC (gel permeation chromatography). In the case that there were two kinds of radical polymerizable compounds, the higher molecular weight was noted. The results are shown in Tables 4 and 5. However, even if the above strict standard is not fulfilled, the weight average molecular weight may be less than 70 or more than 100,000 since there is possibility that conditions are adopted according to a desired application and a desired quality etc., the standard may be thought that it is one of rough indication.

Equipment: Shodex GPC-101 produced by Showa Denko
Column: KF-802, 803, 804, 805 produced by Showa Denko
Solvent, carrier liquid: THF
Flow rate: 1.0 ml/min
Sample concentration: 1.0%
Temperature: 40° C.
Sample injection volume: 200 μl
Detector: Differential Refractive Index Detector (2) Hardness The measurement method was based on JIS K 7215. The hardness of the crystalline or non-crystalline (amorphous) radical polymerizable composition of Examples 12 to 19 and Comparative Examples 3 to 5 shown in Tables 4 and 5 was measured by a durometer (WR-105D produced by Nishi Tokyo Seimitsu Co., Ltd.). The radical polymerizable composition whose temperature is controlled at 90° C. was formed into a flat plate of about 100 mm×100 mm×10 mm and cooled and solidified in a thermostatic chamber at 23° C. The radical polymerizable composition before curing whose temperature is controlled at 23° C., was placed on a horizontal hard table. The pressure reference surface of the durometer was pressed against the surface of the radical polymerizable composition as quickly as possible without impact while keeping parallel to the surface of the radical polymerizable composition and the pressure reference surface to adhere the pressure reference surface to the radical polymerizable composition sufficiently. The maximum indicated value of the pointer of the pointing device was read immediately within one second. The results are shown in Tables 4 and 5. The target hardness was 10, with 15 or more being excellent, 10 or more being good, and less than 10 being acceptable. However, even if the above strict standard is not fulfilled, the hardness may be less than 10 since there is possibility that conditions are adopted according to a desired application and a desired quality etc., the standard may be thought that it is one of rough indication.

(3) A Coefficient of Thermal Conductivity

The measurement method was based on ISO 22007-2. A coefficient of the thermal conductivity was measured using the molded body of the crystalline or non-crystalline radical polymerizable compositions of Examples 12 to 19 and Comparative Examples 3 to 5 shown in Tables 4 and 5. A molded body of the radical polymerizable resin composition was cut into a size of 100 mm and a thickness of 3 mm, and measured at 23° C., by a hot disk method (coefficient of thermal conductivity measuring apparatus TPS2500S, manufactured by Kyoto Electronics Industry Co., Ltd.). The results are shown in Tables 4 and 5. The target coefficient of thermal conductivity is 1.0 W/m·K, and 1.5 W/m·K or more is excellent, 1.0 W/m·K or more is good, and less than 1.0 W/m·K is acceptable. However, even if the above strict standard is not fulfilled, the coefficient of thermal conductivity may be less than 1.0 W/m·K since there is possibility that conditions are adopted according to a desired application and a desired quality etc., the standard may be thought that it is one of rough indication.

(4) Melt Viscosity

The melt viscosity of the crystalline or non-crystalline radical polymerizable composition of Examples 12 to 19 and Comparative Examples 3 to 5 shown in Table 4 and 5 was measured with a high-performance flow tester (CFT-100 EX, manufactured by Shimadzu Corporation). A radical polymerizable composition was placed in a cylinder sample insertion hole heated to 90° C., using the tester equipped with a 2.0 mm diameter and 10 mm long die to apply a pressure of 3 to 100 kgf/cm$^2$ to the piston after preheating for 240 seconds, and the radical polymerizable composition was allowed to flow out from the nozzle of the die, and the melt viscosity was determined from the point of good linearity. The melt viscosity of the composition was measured at three or more points, and the relationship between the melt viscosity of the composition and the shear rate was examined. From the relationship between the melt viscosity of the composition and the shear rate, a melt viscosity having a shear rate of 1000 s-1 was determined by interpolation or extrapolation. The results are shown in Tables 4 and 5. The target melt viscosity was 10 to 2,000 Pa·s, and the composition having 10 to 1,000 Pa·s was excellent, and 1,000 to 2,000 Pa·s was good, and less than 10 Pa·s and/or 2,000 Pa·s is acceptable. However, even if the above strict standard is not fulfilled, the melt viscosity may be less than 10 Pa·s and/or 2,000 Pa s or higher, since there is possibility that conditions are adopted according to a desired application and a desired quality etc., the standard may be thought that it is one of rough indication.

<A Result of Evaluation>

As shown in Table 4, Examples 12 to 19 of the crystalline radical polymerizable composition for the electrical and electronic component of the present invention were excellent in handleability because they are solid at 23° C.

Furthermore, Comparative Example 3 is of a material wherein the crystalline radical polymerizable compound 1 of Example 12 is replaced to an amorphous radical polymerizable compound 1 to change the blending ratio of the inorganic filler. Comparative Example 4 is of a material wherein the crystalline radical polymerizable compound 1 of Example 14 is replaced to an amorphous radical polymerizable compound 1. Further, Comparative Example 5 is of a material wherein the crystalline radical polymerizable compound 1 of Example 12 is replaced to an amorphous radical polymerizable compound 2 to change the blending ratio of the inorganic filler. The composition using only the amorphous radical polymerizable compound resulted in poor handle ability.

As described above, it has been found that the crystalline radical polymerizable composition for the electrical and electronic component containing at least the crystalline radical polymerizable compound has a superior coefficient of thermal conductivity and a superior handleability.

INDUSTRIAL APPLICABILITY

The crystalline radical polymerizable composition for sealing the electrical and electronic component of the present invention and the sealed body of sealing the electrical and electronic component made by using the same have a high glass transition point and excellent heat resistance, so that it is possible to improve the durability of the connector, the harness, the semiconductor package or the electronic component package, the switch having a printed circuit board, the electric and electronic component such as a sensor, the electric and electronic component package or the like, which can be used for automobiles, communication, computers and home appliances etc.

In addition, since the crystalline radical polymerizable composition for electric and electronic component of the present invention and the molded body of the electric and electronic component made by using the same are excellent in thermal conductivity, it is possible to improve the durability of the connector, the harness, the semiconductor package or the electronic component package, the switch having a printed circuit board, the electric and electronic component such as a sensor, the molded body of the electric and electronic component or the like, which can be used for automobiles, communication, computers and home appliances etc.

The invention claimed is:

1. A crystalline radical polymerizable composition for sealing an electrical and electronic component characterized by comprising at least a crystalline radical polymerizable compound having a glass transition point and a melting point, an inorganic filler, a silane coupling agent, and a radical polymerization initiator, wherein the crystalline radical polymerizable composition is solid at 23° C., and wherein the silane coupling agent is selected from an epoxysilane series, an aminosilane series, a cationic silane series, a vinylsilane series, an acrylsilane series, a mercaptosilane series, and a composite system of these.

2. A crystalline radical polymerizable composition for sealing an electrical and electronic component according to claim 1, wherein the crystalline radical polymerizable compound comprises (a) or (b):
  (a) one or more selected from a group consisting of crystalline unsaturated polyester, crystalline epoxy (meth) acrylate, crystalline urethane (meth) acrylate, crystalline polyester (meth) acrylate, and crystalline polyether (meth) acrylate;
  (b) one or more selected from a group consisting of crystalline radical polymerizable monomer, and crystalline radical polymerizable polymer.

3. A crystalline radical polymerizable composition for sealing an electrical and electronic component according to claim 1, wherein the crystalline radical polymerizable compound exhibits a melting point in the range of 30 to 150° C.

4. A crystalline radical polymerizable composition for sealing an electrical and electronic component according to claim 1, wherein the melt viscosity of the crystalline radical polymerizable composition according to a high-grade flow tester is 7 to 1000 Pa-s under the condition of a measured temperature of 90° C., a die diameter of 0.5 mm, a die length of 1.0 mm and at a pressure of 30 kgf/cm$^2$, or 1 to 7 Pa-s at a pressure of 1 kgf/cm$^2$.

5. A crystalline radical polymerizable composition for sealing an electrical and electronic component according to claim 1, wherein an amount of an inorganic filler is 50 to 95 percent by weight for total amount of the crystalline radical polymerizable composition.

6. A crystalline radical polymerizable composition for sealing an electrical and electronic component according to claim 1, wherein the ratio of the crystalline radical polymerizable compound to a total amount of radical polymerizable compound is 30 parts by weight or more.

7. A crystalline radical polymerizable composition for sealing an electrical and electronic component according to claim 1, wherein the weight average molecular weight of the crystalline radical polymerizable compound is 100 to 100,000.

8. A sealed body of an electrical and electronic component sealed by the crystalline radical polymerizable composition for sealing an electrical and electronic component according to claim 1.

9. A granular material comprising the crystalline radical polymerizable composition for sealing an electrical and electronic component according to claim 1.

10. A method of producing a sealed body of an electrical and electronic component, comprising a step of molding the granular material comprising the crystalline radical polymerizable composition for sealing an electrical and electronic component according to claim 9 by means of an insert molding method by an injection molding method or a transfer molding method to seal an electrical and electronic component.

11. A crystalline radical polymerizable composition for an electrical and electronic component characterized by comprising at least a crystalline radical polymerizable compound having a glass transition point and a melting point, an inorganic filler, a silane coupling agent, and a radical polymerization initiator, wherein the crystalline radical polymerizable composition is solid at 23° C., and wherein the silane coupling agent is selected from an epoxysilane series, an aminosilane series, a cationic silane series, a vinylsilane series, an acrylsilane series, a mercaptosilane series, and a composite system of these.

12. A crystalline radical polymerizable composition for an electrical and electronic component according to claim 11, wherein a coefficient of thermal conductivity of the molded body obtained by molding the crystalline radical polymerizable composition for electric and electronic component is 1.0 W/m K or more.

13. A crystalline radical polymerizable composition for an electrical and electronic component according to claim 11, wherein the crystalline radical polymerizable compound comprises (a) or (b):
  (a) one or more selected from a group consisting of crystalline unsaturated polyester, crystalline epoxy (meth) acrylate, crystalline urethane (meth) acrylate, crystalline polyester (meth) acrylate, and crystalline polyether (meth) acrylate;
  (b) one or more selected from a group consisting of crystalline radical polymerizable monomer, and crystalline radical polymerizable polymer.

14. A crystalline radical polymerizable composition for an electrical and electronic component according to claim 11, wherein the crystalline radical polymerizable compound exhibits a melting point in the range of 30 to 150° C.

15. A crystalline radical polymerizable composition for an electrical and electronic component according to claim 11, wherein an amount of an inorganic filler is 40 to 95 percent by weight for total amount of the crystalline radical polymerizable composition.

16. A crystalline radical polymerizable composition for an electrical and electronic component according to claim 11, wherein the ratio of the crystalline radical polymerizable compound to a total amount of radically polymerizable compound is 25 parts by weight or more.

17. A crystalline radical polymerizable composition for an electrical and electronic component according to claim 11, wherein the weight average molecular weight of the crystalline radical polymerizable compound is 70 to 100,000.

18. A molded body of an electrical and electronic component molded by the crystalline radical polymerizable composition for an electrical and electronic component according to claim 11.

19. A molded body of an electrical and electronic component according to claim 18, a coefficient of thermal conductivity of the molded body obtained by molding the crystalline radical polymerizable composition for the electric and electronic component is 1.0 W/m K or more.

20. A granular material comprising the crystalline radical polymerizable composition for an electrical and electronic component according to claim 11.

21. A method of producing a molded body of an electrical and electronic component, comprising a step of molding the granular material comprising the crystalline radical polymerizable composition for an electrical and electronic component according to claim 20 by means of any one of an injection molding method, a transfer molding method, a compression molding method or a hot melt molding method to obtain the molded body of the electrical and electronic component.

\* \* \* \* \*